US012564039B2

(12) United States Patent     (10) Patent No.:    US 12,564,039 B2

Joi et al.             (45) Date of Patent:     Feb. 24, 2026

(54) DOPING PROCESSES IN METAL INTERCONNECT STRUCTURES

(71) Applicant: Lam Research Corporation, Fremont, CA (US)

(72) Inventors: Aniruddha Joi, Milpitas, CA (US); Dries Dictus, Leuven (BE); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 557 days.

(21) Appl. No.: 17/756,169

(22) PCT Filed: Nov. 20, 2020

(86) PCT No.: PCT/US2020/061502

§ 371 (c)(1),
(2) Date: May 18, 2022

(87) PCT Pub. No.: WO2021/108252

PCT Pub. Date: Jun. 3, 2021

(65) Prior Publication Data

US 2022/0415819 A1     Dec. 29, 2022

Related U.S. Application Data

(60) Provisional application No. 62/939,899, filed on Nov. 25, 2019.

(51) Int. Cl.
H01L 23/532       (2006.01)
H01L 21/768       (2006.01)

(52) U.S. Cl.
CPC .. H01L 23/53238 (2013.01); H01L 21/76831 (2013.01); H01L 21/76849 (2013.01);
(Continued)

(58) Field of Classification Search
CPC ......... H01L 23/53238; H01L 21/76831; H01L 21/76849; H01L 21/76858;
(Continued)

(56) References Cited

U.S. PATENT DOCUMENTS 5,695,810 A    12/1997   Dubin et al.
6,153,519 A    11/2000   Jain et al.
(Continued)

FOREIGN PATENT DOCUMENTS

KR     20000047634 A     7/2000
KR     20100130551 A     12/2010
(Continued)

OTHER PUBLICATIONS

Aloha, Air Liquide Electronics, "RuEtCp2," Aloha™ CVD/ALD Materials, 2 pages.
(Continued)

*Primary Examiner* — Norman D Richards
*Assistant Examiner* — Laura M Dykes
(74) *Attorney, Agent, or Firm* — Weaver Austin Villeneuve & Sampson LLP

(57) ABSTRACT

A metal interconnect structure is doped with zinc, indium, or gallium using top-down doping processes to improve diffusion barrier properties with minimal impact on line resistance. Dopant is introduced prior to metallization or after metallization. Dopant may be introduced by chemical vapor deposition on a liner layer at an elevated temperature prior to metallization, by chemical vapor deposition on a metal feature at an elevated temperature after metallization, or by electroless deposition on a copper feature after metallization. Application of elevated temperatures causes the metal interconnect structure to be doped and form a self-formed barrier layer or strengthen an existing diffusion barrier layer.

7 Claims, 14 Drawing Sheets

(52) U.S. Cl.
CPC .. *H01L 21/76858* (2013.01); *H01L 21/76864* (2013.01); *H01L 21/76874* (2013.01); *H01L 21/76879* (2013.01)

(58) Field of Classification Search
CPC ......... H01L 21/76864; H01L 21/76874; H01L 21/76879
USPC ....................................................... 257/751
See application file for complete search history.

(56) References Cited

U.S. PATENT DOCUMENTS

| | | | |
|---|---|---|---|
| 6,323,131 B1 | 11/2001 | Obeng et al. | |
| 6,342,733 B1 | 1/2002 | Hu et al. | |
| 6,753,248 B1 | 6/2004 | Wood et al. | |
| 6,844,258 B1 | 1/2005 | Fair et al. | |
| 6,899,816 B2 | 5/2005 | Padhi et al. | |
| 7,157,798 B1 | 1/2007 | Fair et al. | |
| 7,256,466 B2 | 8/2007 | Lieber et al. | |
| 7,994,640 B1 | 8/2011 | Alers et al. | |
| 8,039,379 B1 | 10/2011 | Alers et al. | |
| 8,278,216 B1 | 10/2012 | Alers et al. | |
| 9,640,428 B2 | 5/2017 | Chi et al. | |
| 10,192,829 B2 | 1/2019 | Briggs et al. | |
| 10,224,284 B1 | 3/2019 | Witt | |
| 2003/0082587 A1 | 5/2003 | Seul et al. | |
| 2004/0105934 A1 | 6/2004 | Chang et al. | |
| 2004/0127001 A1 | 7/2004 | Colburn et al. | |
| 2004/0175631 A1 | 9/2004 | Crocker et al. | |
| 2005/0119725 A1 | 6/2005 | Wang et al. | |
| 2005/0129843 A1 | 6/2005 | Wu et al. | |
| 2006/0108320 A1 | 5/2006 | Lazovsky et al. | |
| 2006/0113675 A1 | 6/2006 | Chang et al. | |
| 2006/0118921 A1 | 6/2006 | Lin et al. | |
| 2006/0189113 A1 | 8/2006 | Vanheusden et al. | |
| 2006/0254503 A1 | 11/2006 | Dai et al. | |
| 2006/0254504 A1 | 11/2006 | Dai et al. | |
| 2006/0292846 A1 | 12/2006 | Pinto et al. | |
| 2007/0134420 A1 | 6/2007 | Koberstein et al. | |
| 2007/0202678 A1 | 8/2007 | Plombon et al. | |
| 2008/0067679 A1 | 3/2008 | Takagi et al. | |
| 2016/0056112 A1* | 2/2016 | Edelstein | H01L 23/5226 |
| 2016/0270237 A1 | 9/2016 | Cho et al. | |
| 2017/0005038 A1 | 1/2017 | Lee et al. | |
| 2018/0374747 A1 | 12/2018 | Joi et al. | |
| 2019/0122922 A1 | 4/2019 | Joi et al. | |
| 2019/0363048 A1 | 11/2019 | Zhao et al. | |
| 2020/0216949 A1 | 7/2020 | Bhuyan et al. | |
| 2020/0235055 A1* | 7/2020 | Hegde | H01L 21/76856 |
| 2024/0213159 A1 | 6/2024 | Parbatani et al. | |
| 2025/0096036 A1 | 3/2025 | Parbatani et al. | |

FOREIGN PATENT DOCUMENTS

| | | |
|---|---|---|
| KR | 20170095164 A | 8/2017 |
| KR | 20180075898 A | 7/2018 |
| KR | 20190050869 A | 5/2019 |
| WO | WO-2006124769 A2 | 11/2006 |
| WO | WO-2021067118 A1 | 4/2021 |

OTHER PUBLICATIONS

Barmak, et al. "On the use alloying for Cu Interconnect applications" J. Vac. Sci. Technol. B 24(6) Nov./Dec. 2006 (2006) pp. 2485-2498.

Becker et al. (2003) "Highly Conformal Thin Films of Tungsten Nitride Prepared by Atomic Layer Deposition from a Novel Precursor," Chem. Mater, 15(15):2969-2976.

Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].

Cao, L.F. et al. (2006) "Thermal stability of Fe, Co, Ni metal nanoparticles," phys. Stat. sol. (b) 243(12):2745-2755.

Chen, Shaowei et al. (1999) "Electrochemical Quantized Capacitance Charging of Surface Ensembles of Gold Nanoparticles," J. Phys. Chem. B, 103(45):9996-10000.

Chen, Wei et al. (2006) "Carbene-Functionalized Ruthenium Nanoparticles," Chem. Mater, 18:5253-5259.

Cheng, Guangjun et al. (Dec. 20, 2005) "Magnetic-Field-Induced Assemblies of Cobalt Nanoparticles," Langmuir The ACS Journal of Surfaces and Colloids, American Chemical Society, 21(26):12055-12059.

Chirea, M. et al. (2005) "Electrochemical Characterization of Polyelectrolyte/Gold Nanoparticle Multilayers Self-Assembled on Gold Electrodes," J. Phys. Chem. B, 109(46):21808-21817.

Chiu et al. (Jun. 1993) "Tungsten nitride thin films prepared by MOCVD," J. Mater. Res., 8(6):1353-1360.

Crane et al. (2001) "Kinetic and Mechanistic Studies of the Chemical Vapor Deposition of Tungsten Nitride from Bis(Tertbutylimido) Bis(Tertbutylamido) Tungsten," J. Phys. Chem. B, 105(17):3549-3556.

Gladfelter, Wayne L. (1993) "Selective Metallization by Chemical Vapor Deposition," Chem. Mater, 5(10):1372-1388.

Hu, C.K. et al. (Jun. 14, 2004) "Atom motion of Cu and Co in Cu damascene lines with a CoWP cap," Applied Physics Letters, American Institute of Physics, 84(24):4986-4988.

Kim et al. (2003) "Characteristics of Tungsten Carbide Films Prepared by Plasma-Assisted ALD Using Bis(tert-butylimido)bis(dimethylamido) tungsten," Journal of The Electrochemical Society, 150(10):C740-C744.

Kwon, Oh-Kyum et al. (2004) "PEALD of a Ruthenium Adhesion Layer for Copper Interconnects," Journal of The Electrochemical Society, 151(12):C753-C756.

Lee, Don Keun et al. (2006) "Preparation of monodisperse Co and Fe nanoparticle using precursor of M2+-oleate2 (M=Co, Fe)," Current Applied Physics 6:786-790.

Parod-Yissar, V. et al. (2001) "Layered Polyelectrolyte Films on Au Electrodes: Characterization of Electron-Transfer Features at the Charged Polymer Interface and Application for Selective Redox Reactions," American Chemical Society, Langmuir 2001, 17(4):1110-1118.

Tsai, et al. (Mar. 4, 1996) "Metalorganic chemical vapor deposition of tungsten nitride for advanced metallization," Appl. Phys. Lett. 68(10):1412-1414.

US Final Office Action, dated Apr. 12, 2011, issued in U.S. Appl. No. 11/772,767.

US Final Office Action, dated Apr. 8, 2010, issued in U.S. Appl. No. 11/506,761.

US Final Office Action, dated Feb. 23, 2010, issued in U.S. Appl. No. 11/772,784.

US Final Office Action, dated Jan. 25, 2010, issued in U.S. Appl. No. 12/044,918.

US Final Office Action, dated Jan. 6, 2010, issued in U.S. Appl. No. 11/506,761.

US Final Office Action, dated Jul. 26, 2011, issued in U.S. Appl. No. 11/772,773.

US Final Office Action, dated May 17, 2006, issued in U.S. Appl. No. 10/984,126.

US Notice of Allowance, dated Apr. 11, 2011, issued in U.S. Appl. No. 11/772,784.

US Notice of Allowance, dated Aug. 25, 2006, issued in U.S. Appl. No. 10/984,126.

US Notice of Allowance, dated Dec. 28, 2010, issued in U.S. Appl. No. 11/772,784.

US Notice of Allowance dated Jun. 27, 2011, issued in U.S. Appl. No. 11/772,767.

US Notice of Allowance, dated Mar. 28, 2012, issued in U.S. Appl. No. 11/506,761.

US Office Action, dated Apr. 19, 2011, issued in U.S. Appl. No. 11/506,761.

US Office Action, dated Aug. 26, 2008, issued in U.S. Appl. No. 11/506,761.

US Office Action, dated Aug. 28, 2009, issued in U.S. Appl. No. 11/772,784.

(56)        References Cited

OTHER PUBLICATIONS

US Office Action, dated Feb. 24, 2009, issued in U.S. Appl. No. 11/506,761.
US Office Action, dated Jan. 11, 2011, issued in U.S. Appl. No. 11/772,773.
US Office Action, dated Jun. 22, 2009, issued in U.S. Appl. No. 12/044,918.
US Office Action, dated Nov. 23, 2005, issued in U.S. Appl. No. 10/984,126.
US Office Action, dated Oct. 14, 2011, issued in U.S. Appl. No. 11/506,761.
US Office Action, dated Sep. 22, 2010, issued in U.S. Appl. No. 11/772,767.
US Office Action, dated Sep. 29, 2010, issued in U.S. Appl. No. 11/772,773.
U.S. Appl. No. 11/772,773, inventor Alers et al., filed Jul. 2, 2007.
U.S. Appl. No. 12/044,918, inventor Alers et al., filed Mar. 7, 2008.
Wu et al. (Sep./Oct. 2003) "Surface reaction of bis(tertbutylimido) bis(diethylamido)tungsten precursor on Si(100)-(2X1)," J. Vac. Sci. Technol. A 21(5):1620-1624.
Zimmerman, C.G. et al. (Aug. 9, 1999) "Burrowing of Co Nanoparticles on Clean Cu and Ag Surfaces," Physical Review Letters, The American Physical Society, 83(6):1163-1166.
International Preliminary Report on Patentability and Written Opinion dated Feb. 1, 2024 in PCT Application No. PCT/US2022/073905.
International Preliminary Report on Patentability and Written Opinion dated Feb. 1, 2024 in PCT Application No. PCT/US2022/073906.
International Search Report and Written Opinion dated Nov. 11, 2022 in PCT Application No. PCT/US2022/073906.
International Search Report and Written Opinion dated Nov. 16, 2022 in PCT Application No. PCT/US2022/073905.
U.S. Appl. No. 18/291,532, inventor Parbatani A, filed Jan. 23, 2024.
International Preliminary Report on Patentability and Written opinion dated Jun. 9, 2022 in Application No. PCT/US2020/061502.
KR Office Action dated Jan. 30, 2025 in KR Application No. 10-2022-7021488, with English Translation.
International Search Report and Written Opinion dated Mar. 4, 2021 in PCT Application No. PCT/US2020/061502.

* cited by examiner

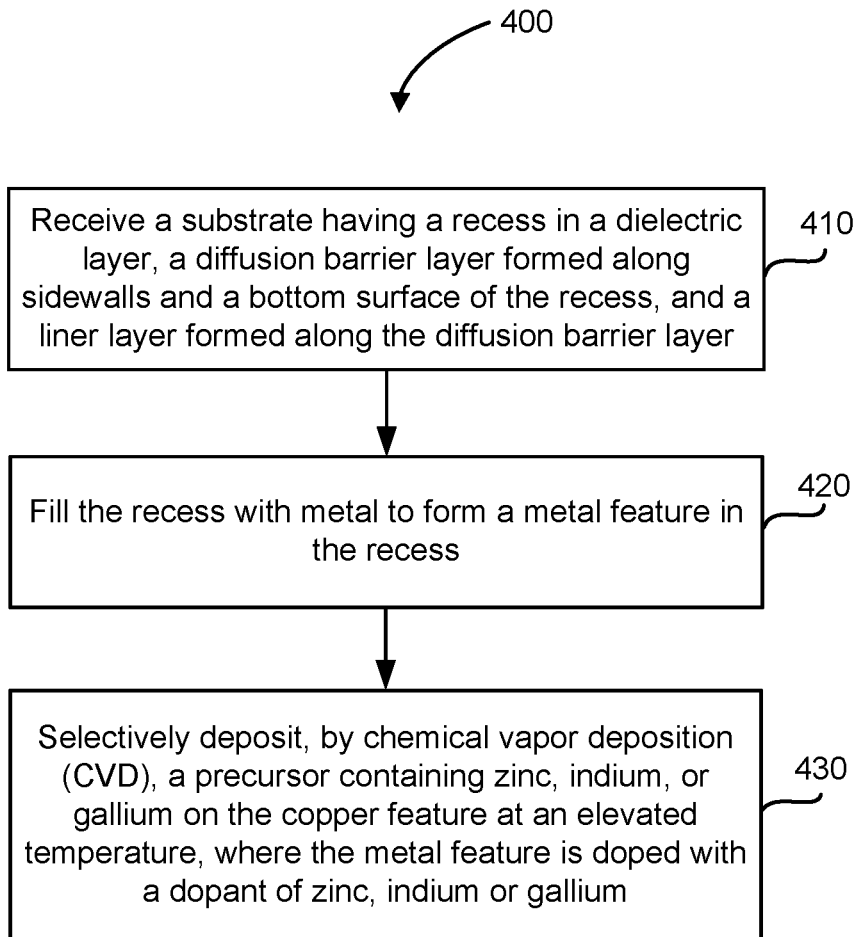

Receive a substrate having a recess in a dielectric layer, a diffusion barrier layer formed along sidewalls and a bottom surface of the recess, and a liner layer formed along the diffusion barrier layer | 410

Fill the recess with metal to form a metal feature in the recess | 420

Selectively deposit, by chemical vapor deposition (CVD), a precursor containing zinc, indium, or gallium on the copper feature at an elevated temperature, where the metal feature is doped with a dopant of zinc, indium or gallium | 430

FIGURE 4

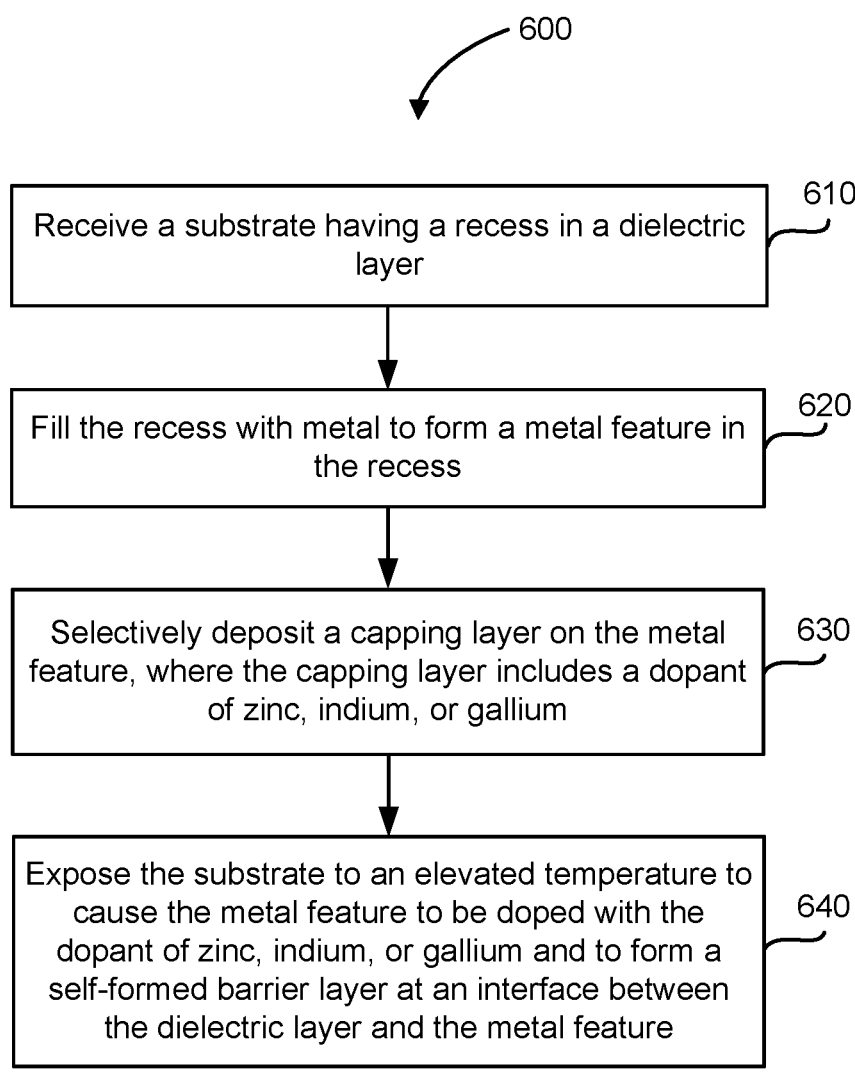

600

Receive a substrate having a recess in a dielectric layer    610

Fill the recess with metal to form a metal feature in the recess    620

Selectively deposit a capping layer on the metal feature, where the capping layer includes a dopant of zinc, indium, or gallium    630

Expose the substrate to an elevated temperature to cause the metal feature to be doped with the dopant of zinc, indium, or gallium and to form a self-formed barrier layer at an interface between the dielectric layer and the metal feature    640

FIGURE 6

DOPING PROCESSES IN METAL INTERCONNECT STRUCTURES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor devices may be formed in a multi-level arrangement with electrically conductive structures in different levels insulated from each other by one or more intervening layers of dielectric material. The formation of electrically conductive structures in the semiconductor devices can be achieved using damascene or dual damascene processes. Trenches and/or holes are etched into the dielectric material and may be lined with one or more liner layers and barrier layers. Electrically conductive material may be deposited in the trenches and/or holes to form vias, contacts, or other interconnect features that extend through the dielectric material and provide electrical interconnection between the electrically conductive structures.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of forming a self-formed barrier layer. The method includes receiving a substrate having a recess in a dielectric layer and a liner layer formed along sidewalls and a bottom surface of the recess, depositing, by chemical vapor deposition (CVD), a precursor containing zinc, indium, or gallium on the liner layer at an elevated temperature, thereby causing the liner layer to be doped with a dopant of zinc, indium, or gallium, and forming, at an interface between the liner layer and the dielectric layer while the substrate is exposed to the elevated temperature, a self-formed barrier layer comprising a reaction product between the dielectric layer and the dopant.

In some implementations, the method further includes forming, at exposed surfaces of the liner layer, a self-formed protective layer comprising zinc oxide, indium oxide, or gallium oxide. In some implementations, the method further includes transferring the substrate out of a reaction chamber to expose the substrate to an air break, where the self-formed protective layer is formed during exposure to the air break. In some implementations, the method further includes filling the recess with copper, where forming the self-formed barrier layer occurs after forming the liner layer and before filling the recess with copper. In some implementations, the elevated temperature is between about 80° C. and about 400° C. In some implementations, the dielectric layer includes silicon and oxygen, and the self-formed barrier layer includes zinc silicate, indium silicate, or gallium silicate. In some implementations, the liner layer has a dopant concentration between about 1 atomic percent and about 20 atomic percent. In some implementations, doping the liner layer and forming the self-formed barrier layer occurs without annealing the substrate.

Another aspect involves a metal interconnect structure for a semiconductor device. The metal interconnect structure includes a first metal line, a dielectric layer over the first metal line, a metal feature extending through the dielectric layer providing electrical interconnection between the first metal line and a second metal line, a liner layer along sidewalls and a bottom surface of the metal feature, and a self-formed barrier layer at an interface between the dielectric layer and the liner layer, where the self-formed barrier layer includes a reaction product between the dielectric layer and a dopant of zinc, indium, or gallium.

In some implementations, the metal interconnect structure further includes a self-formed protective layer at an interface between the liner layer and the metal feature, where the self-formed protective layer includes a reaction product between oxygen and the dopant. In some implementations, the liner layer includes ruthenium, cobalt, or combinations thereof, and the dielectric layer includes silicon and oxygen. In some implementations, the liner layer is doped with zinc, indium, or gallium, and the liner layer has a dopant concentration between about 1 atomic percent and about 20 atomic percent.

Another aspect involves a method of selectively doping a metal feature. The method includes receiving a substrate having a recess in a dielectric layer, a diffusion barrier layer formed along sidewalls and a bottom surface of the recess, and a liner layer formed along the diffusion barrier layer. The method further includes filling the recess with metal to form a metal feature in the recess, and selectively depositing, by CVD, a precursor containing zinc, indium, or gallium on the copper feature at an elevated temperature, where the metal feature is doped with a dopant of zinc, indium, or gallium.

In some implementations, selectively depositing the precursor on the metal feature forms a capping layer including the dopant. In some implementations, the method further includes forming an interface having the dopant between the liner layer and the diffusion barrier layer, where the interface increases diffusion barrier properties of the diffusion barrier layer. In some implementations, the metal feature has a dopant concentration between about 1 atomic percent and about 2 atomic percent. In some implementations, selectively depositing the precursor selectively deposits the precursor on the metal feature without depositing on the dielectric layer. In some implementations, the elevated temperature is between about 80° C. and about 400° C. In some implementations, the dopant includes zinc, where the liner layer includes ruthenium, cobalt, or combinations thereof, and the dielectric layer includes silicon and oxygen.

Another aspect involves a method of selectively doping a metal feature. The method includes receiving a substrate having a recess in a dielectric layer, filling the recess with metal to form a copper feature in the recess, selectively depositing a capping layer on the metal feature, where the capping layer includes a dopant of zinc, indium, or gallium, and exposing the substrate to an elevated temperature to cause the metal feature to be doped with the dopant of zinc, indium, or gallium and to form a self-formed barrier layer at an interface between the dielectric layer and the metal feature.

In some implementations, exposing the substrate to the elevated temperature is performed simultaneous with selectively depositing the capping layer or after selectively depositing the capping layer, where the elevated temperature is between about 80° C. and about 400° C. In some implementations, the metal feature has a dopant concentration between about 1 atomic percent and about 2 atomic percent. In some implementations, selectively depositing the capping layer is performed by electroless deposition or CVD. In some implementations, selectively depositing the capping layer selectively deposits the capping layer on the metal feature without depositing on the dielectric layer.

These and other aspects are described further below with reference to the drawings.

BRIEF DESCRIPTION OF THE DRAWINGS

FIG. 4 shows a flow diagram of an example method of selectively doping a metal interconnect structure according to some implementations.

FIG. 6 shows a flow diagram of an example method of selectively doping a metal interconnect structure according to some implementations.

DETAILED DESCRIPTION

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

INTRODUCTION

Fabrication of electrically conductive structures in semiconductor devices often involves metal wiring that connects between semiconductor devices, other interconnecting wiring, and chip package connections. The electrically conductive structures may include line features (e.g., metal lines or metallization layers) that traverse a distance across a chip, and vertical interconnect features (e.g., vias) that connect the features in different levels. The interconnect features usually include copper (Cu), cobalt (Co), aluminum, or tungsten (W) in both line and via structures, but may be fabricated with other conductive metals. The line features and interconnect features may be insulated by interlayer dielectrics (ILD) which are electrical insulators. Metal lines formed in adjacent ILD layers may be connected to each other by a series of vias or interconnect features. A stack containing multiple metal lines electrically connected to each other by one or more vias is most often formed by a process known as dual damascene processing, but may also be formed using single damascene or subtractive processes. While the methods, apparatuses, and devices described below may be presented in the context of damascene processing, it will be understood that the methods, apparatuses, and devices of the present disclosure are not limited to only damascene processing and may be used in the context of other processing methods.

Figure 1:
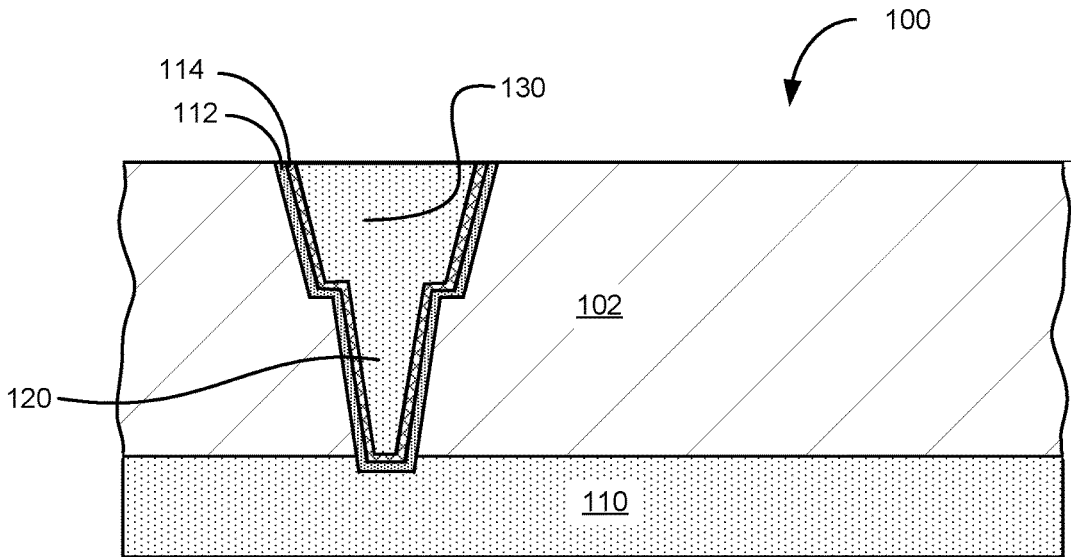
FIG. 1 shows a cross-sectional schematic illustration of an example metal interconnect structure according to some implementations.

FIG. 1 shows a cross-sectional schematic illustration of an example metal interconnect structure according to some implementations. The metal interconnect structure may include a substrate 100, where the substrate 100 may be a semiconductor wafer, built on a semiconductor wafer, or part of a semiconductor wafer. The substrate 100 may include a first metal line 110 and a dielectric layer 102. In some implementations, the dielectric layer 102 includes a dielectric material such as silicon oxide, fluorine-doped or carbon-doped silicon oxide, or an organic-containing low-k material such as an organosilicate glass (OSG). In some implementations, the dielectric layer 102 includes silicon and oxygen. In some implementations, the dielectric layer 102 may include multiple layers of dielectric materials. Recesses may be provided through the dielectric layer 102, where the recesses may include openings and trenches. A diffusion barrier layer 112 may line the sidewalls and bottom surface of the recesses. The diffusion barrier layer 112 may serve to protect the dielectric layer 102 and underlying active devices from diffusion of metal (e.g., copper). Examples of diffusion barrier materials include but are not limited to titanium (Ti), tantalum (Ta), tantalum nitride (TaN), and titanium nitride (TiN).

A liner layer 114 may be deposited on the diffusion barrier layer 112. The liner layer 114 may be conformal along the diffusion barrier layer 112. In some implementations, the liner layer 114 promotes adhesion of copper with the surrounding material. Examples of liner layer materials include but are not limited to cobalt (Co) and ruthenium (Ru).

The recesses may be filled with metal. Deposition of metal to fill the recesses may occur by bulk electrodeposition processes such as electroplating or electroless plating. One or more openings of a lower portion of the recesses may be filled with metal to provide a conductive via 120, and one or more trenches of an upper portion of the recesses may be filled with metal to provide a second metal line 130. The metal fill provides the second metal line 130 over the first metal line with the conductive via 120 providing electrical interconnection between the first metal line 110 and the second metal line 130. In some implementations, the metal interconnect structure is defined by the first metal line 110, the conductive via 120, and the second metal line 130, where the metal interconnect structure may be a dual damascene structure. In some implementations, a planarization process such as chemical mechanical planarization (CMP) may follow after filling the recesses to remove any metal overburden.

In order to improve semiconductor device performance, feature sizes are becoming smaller and smaller with each technology node. As a result, interconnect features and vias have also shrunk. This presents many challenges during fabrication and maintaining device performance and reliability. For example, with narrower vias and interconnect features, the conductive via 120 in the metal interconnect structure occupies a smaller cross-sectional area. However, the presence of the diffusion barrier layer 112 and the liner layer 114 limits direct electrical contact between the conductive via 120 and the first metal line 110. The diffusion barrier layer 112 is typically made of an electrically resistive material. As the conductive via 120 occupies a smaller and smaller cross-sectional area with each technology node, the diffusion barrier layer 112 takes up a greater percentage of the cross-sectional area. As a result, a line resistance between the conductive via 120 and the first metal line 110 increases.

If the metal interconnect structure is without a diffusion barrier layer 112 or with only a weakened/thin diffusion barrier layer 112, then the metal interconnect structure may be unable to provide adequate resistance to electromigration and/or stress migration. Electromigration is caused by the gradual movement of ions between electrons and diffusing metal atoms. The diffusion of metal (e.g., copper) into the surrounding dielectric material may adversely affect the electrically insulating properties of the surrounding dielectric material. The diffusion of metal may also undesirably result in the formation of voids in the vias or in the metal lines. In addition, the metal interconnect structure may be vulnerable to time-dependent dielectric breakdown (TDDB), which is a failure mode whereby an insulating layer (e.g., the dielectric layer 102) no longer serves as an adequate electrical insulator in typical electric fields. Electromigration, stress migration, and TDDB may decrease the reliability of the metal interconnect structure in semiconductor devices.

Improvements to metal interconnect structures may be made by increasing resistance to electromigration and/or stress migration without significantly increasing the electrical resistance of lines. Metal interconnect structures may be doped with a metal dopant to improve resistance to electromigration and/or stress migration. For example, copper in copper interconnect structures may be doped with manganese (Mn). However, many approaches to doping copper with manganese are done by physical vapor deposition (PVD), which is non-selective and not scalable to high-aspect ratio geometries. Furthermore, doping copper with manganese leads to an increased line resistance, where the increase in line resistance is greater compared against other dopants. In other examples, copper in copper interconnect structures may be doped with cobalt or nickel. However, doping copper with cobalt or nickel also leads to an increased line resistance, and such dopants do not easily segregate in copper.

The present disclosure relates to introducing dopants of zinc, indium, or gallium to improve interfacial barrier properties between metal and surrounding dielectric material with minimal resistivity impact. In some implementations, the dopant consists of zinc. A dopant such as zinc lessens the resistivity impact compared to other dopants such as manganese, cobalt, and nickel. The dopant may be introduced in a top-down method. This is in contrast to typical bottom-up growth of doped metal, where the dopant is introduced with the deposition of metal. The metal may include, for example, copper, aluminum, cobalt, tungsten, or combinations thereof. In some implementations of the present disclosure, the dopant is introduced in a chemical vapor deposition (CVD) process at an elevated temperature prior to electrofill, where introduction of the dopant dopes a liner layer and forms a self-formed barrier layer between the liner layer and a dielectric layer. In some implementations of the present disclosure, the dopant is selectively deposited on a metal layer by CVD at an elevated temperature after electrofill, where the selectively deposited dopant strengthens a diffusion barrier layer and provides a capping layer on the metal layer. In some implementations of the present disclosure, the dopant is selectively deposited on a metal layer by CVD or electroless deposition after electrofill, where the selectively deposited dopant provides a capping layer on the metal layer and forms a self-formed barrier layer between the metal layer and a dielectric layer.

Doping of Liner Layer and Formation of Self-Formed Barrier Layer

In some implementations of the present disclosure, doping may occur prior to metallization (e.g., electrofill). Introduction of a dopant of zinc, indium, or gallium may occur by CVD at an elevated temperature on a liner layer. Some of the dopant may segregate through the liner layer during exposure to the elevated temperature and form a self-formed barrier layer at an interface between a dielectric layer and the liner layer. Some of the dopant may react with oxygen at exposed surfaces of the liner layer during an air break and form a self-formed protective layer on the liner layer. Metallization follows to provide a metal interconnect structure having diffusion barrier properties with minimal impact on resistivity, improved resistance to electromigration and/or stress migration, and improved resistance to oxidation.

Figure 2:
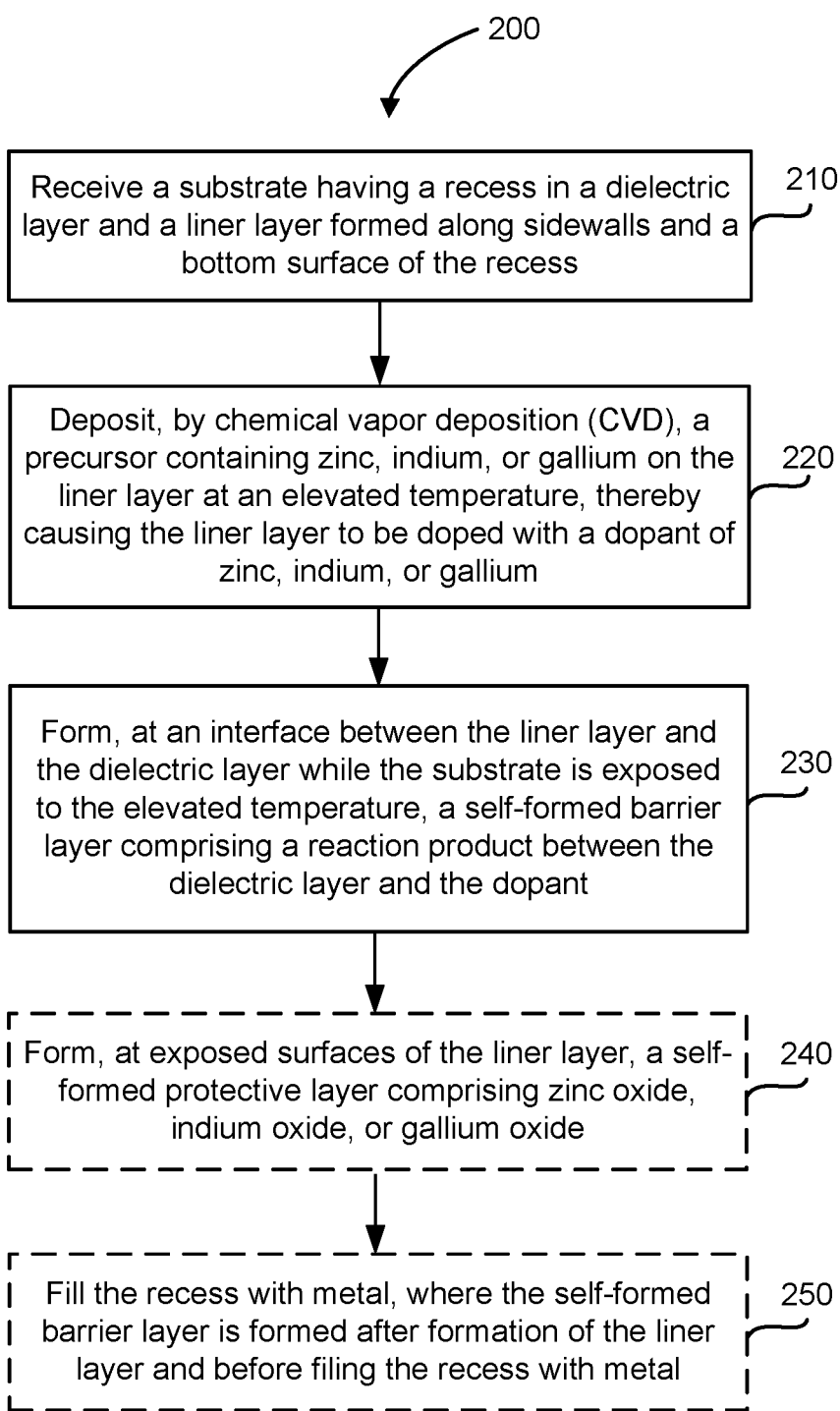
FIG. 2 shows a flow diagram of an example method of forming a self-formed barrier layer according to some implementations.
Figure 8:
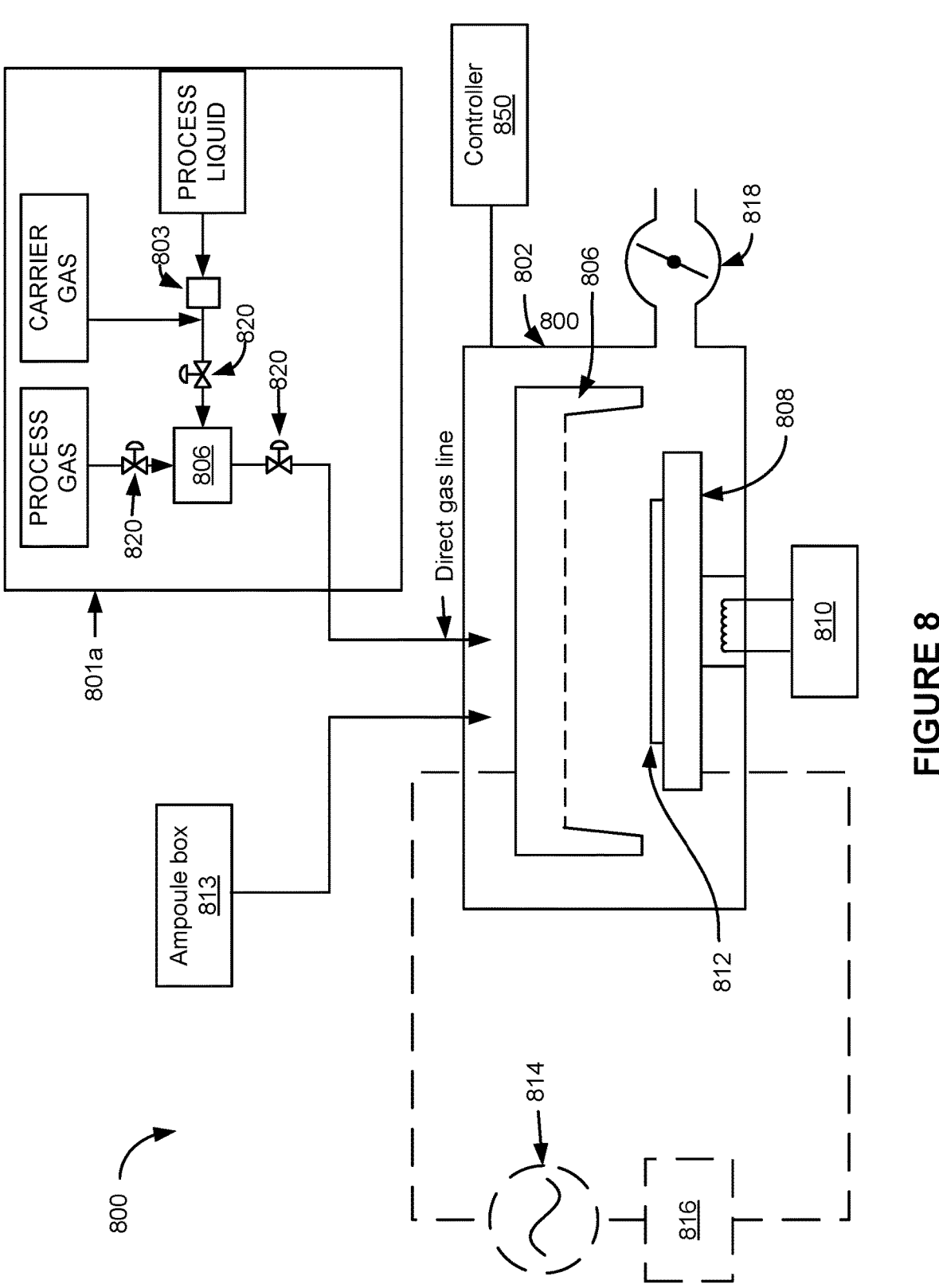
FIG. 8 shows a schematic diagram of an example process chamber for performing certain operations of the disclosed implementations.
Figure 9:
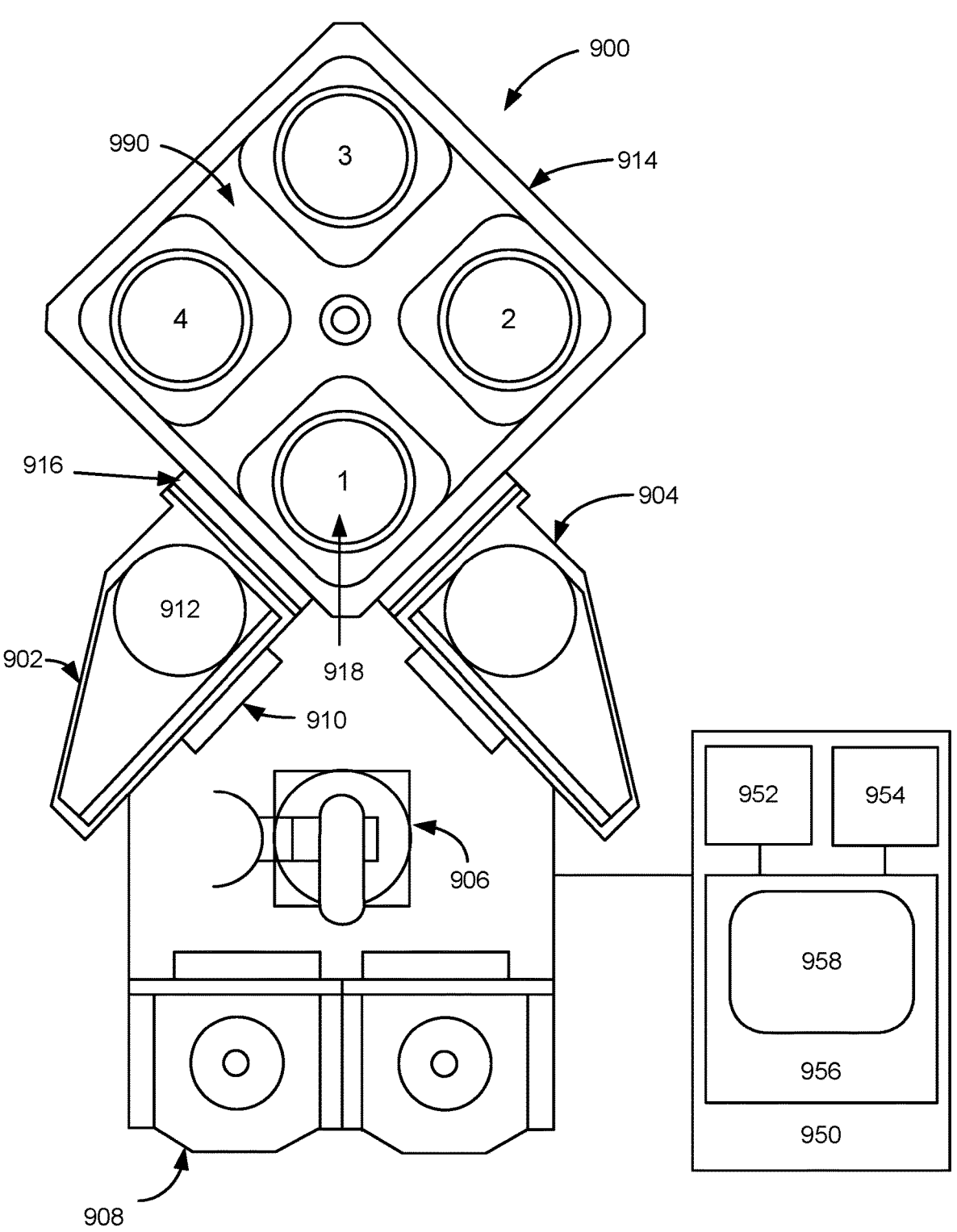
FIG. 9 shows a schematic diagram of an example process tool for performing certain operations of the disclosed implementations.

FIG. 2 shows a flow diagram of an example method of forming a self-formed barrier layer according to some implementations. The operations in a process 200 may be performed in different orders and/or with different, fewer, or additional operations. Accompanying the description of the process 200 in FIG. 2 is a series of cross-sectional schematic illustrations of an example process of forming a self-formed barrier layer and self-formed protective layer in a metal interconnect structure according to some implementations in FIGS. 3A-3E. One or more operations of the process 200 may be performed using an apparatus as shown in FIG. 8 or 9.

At block 210 of the process 200, a substrate is received having a recess in a dielectric layer and a liner layer formed along sidewalls and a bottom surface of the trench. The dielectric layer may also be referred to as an interlayer dielectric or insulating layer. In some implementations, the dielectric layer includes a dielectric material or low-k dielectric material, where the dielectric material may include silicon and oxygen. For example, the dielectric layer includes silicon oxide, fluorine-doped or carbon-doped silicon oxide, or an organic-containing low-k material such as an OSG. The recess may be formed through at least a portion of the dielectric layer. The recess may be patterned and formed using standard lithography processes. The recess may have a high aspect ratio or high depth-to-width aspect ratio. In some implementations, an aspect ratio of the recess may be equal to or greater than about 5:1, equal to or greater than about 10:1, equal to or greater than about 20:1, or equal to or greater than about 30:1. It will be understood that the recess may also be referred to as a feature, etched feature, trench, opening, hole, contact hole, slit, channel, or cavity.

The recess may be formed according to a damascene or dual damascene fabrication process.

In some implementations, the recess includes a trench formed in an upper portion of the dielectric layer and an opening formed in a lower portion of the dielectric layer. The opening may extend from a bottom of the trench to a top of a first metal line. Thus, the opening may expose a top surface of the first metal line. The trench and the opening may be formed according to a dual damascene fabrication process.

A liner layer is deposited along the sidewalls and bottom surface of the recess. In some implementations, the liner layer is conformally deposited along surfaces of the dielectric layer in the recess. In damascene or dual damascene fabrication processes, the liner layer may be conformally deposited along surfaces of the dielectric layer in the recess and on the top surface of the first metal line. In some implementations, no diffusion barrier layer is formed at an interface between the liner layer and the dielectric layer.

In some implementations, the liner layer includes cobalt, ruthenium, or combinations thereof. In some implementations, a thickness of the liner layer is between about 0.5 nm and about 10 nm or between about 1 nm and about 5 nm.

Figure 3A:
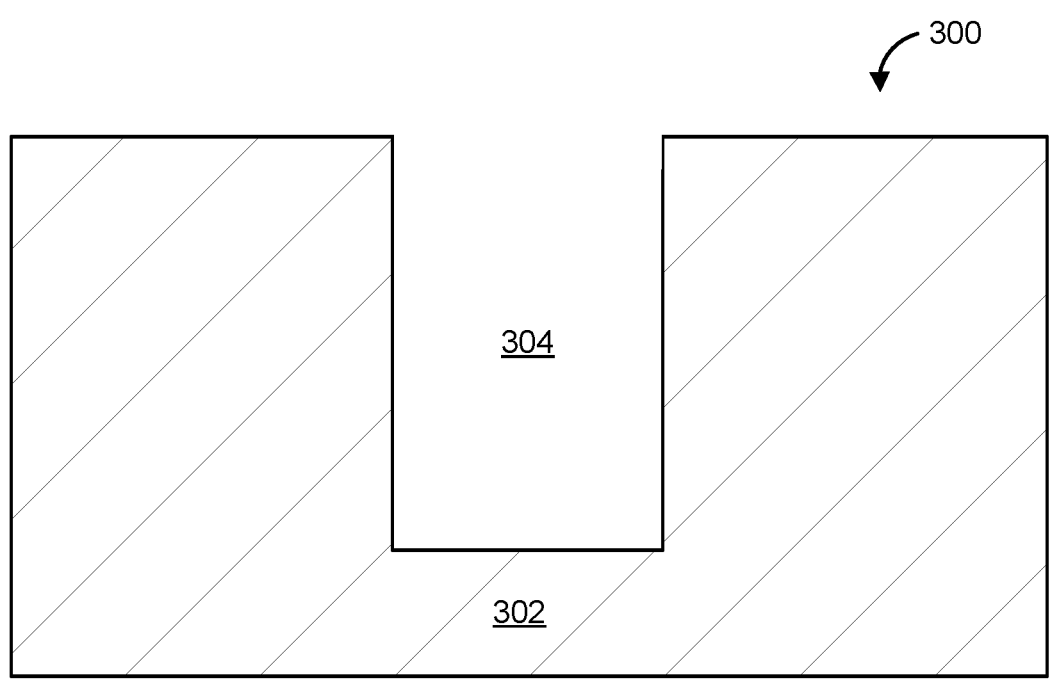
FIGS. 3A-3E show cross-sectional schematic illustrations of an example process of forming a self-formed barrier layer and self-formed protective layer in a metal interconnect structure according to some implementations.

FIG. 3A shows a cross-sectional schematic illustration of an example substrate with a dielectric layer having a recess for a partially fabricated metal interconnect structure. A substrate 300 includes a dielectric layer 302. The dielectric layer 302 has a recess 304 extending at least partially through the dielectric layer 302. The recess 304 may be an etched feature that is patterned using standard lithography techniques. The recess 304 may have a depth-to-width aspect ratio of at least 5:1, at least 10:1, at least 20:1, or at least 30:1. The recess 304 may have any suitable geometric shape or series of geometric shapes, such as cylindrical, rectangular, or polygonal. The dielectric layer 302 includes a dielectric material such as silicon oxide, fluorine-doped or carbon-doped silicon oxide, or an organic-containing low-k material such as an OSG. In some implementations, the dielectric layer 302 may include multiple layers of dielectric silicon and oxygen.

Figure 3B:
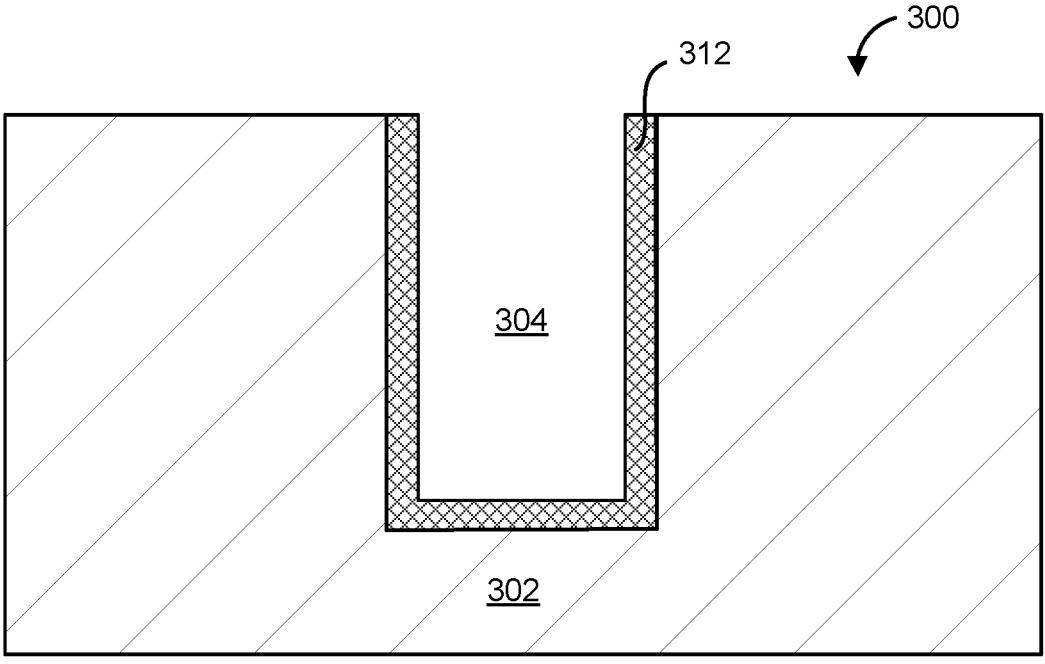

FIG. 3B shows a cross-sectional schematic illustration of the substrate from FIG. 3A with a liner layer conformally deposited along sidewalls and a bottom surface of the recess for a partially fabricated metal interconnect structure. A liner layer 312 is conformally deposited along sidewalls and bottom surface of the recess 304 of the dielectric layer 302. No diffusion barrier layer is formed between the dielectric layer 302 and the liner layer 312. In some implementations, the liner layer 312 is deposited using any suitable deposition technique such as physical vapor deposition (PVD), atomic layer deposition (ALD), chemical vapor deposition (CVD), or plasma-enhanced chemical vapor deposition (PECVD). In some implementations, the liner layer 312 includes cobalt, ruthenium, or combinations thereof. In some implementations, a thickness of the liner layer 312 is between about 0.5 nm and about 10 nm or between about 1 nm and about 5 nm.

Returning to FIG. 2, at block 220 of the process 200, a precursor containing zinc, indium, or gallium is deposited by CVD on the liner layer at an elevated temperature, thereby causing the liner layer to be doped with a dopant of zinc, indium, or gallium. In some implementations, the precursor contains zinc and the dopant consists of zinc. A precursor in the gas phase may be flowed into the recess and adsorbed onto exposed surfaces of the liner layer. The precursor may be deposited non-selectively on the surface of the liner layer as well as other surfaces. Alternatively, the precursor may be deposited selectively on the surface of the liner layer. In some implementations, the precursor may be a suitable zinc-containing compound such as diethyl zinc or dimethyl zinc. In some implementations, the precursor may be a suitable indium-containing compound such as trimethyl indium. In some implementations, the precursor may be a suitable gallium-containing compound such as trimethyl gallium. Deposition of the precursor on the liner layer occurs prior to metallization (e.g., copper fill) in the recess.

Deposition of the precursor on the liner layer may occur while the substrate is exposed to the elevated temperature to promote thermal diffusion of dopant into the liner layer. In some implementations, the elevated temperature is between about 60° C. and about 500° C. or between about 80° C. and about 400° C. However, it will be understood that the temperature range of the elevated temperature may depend on the chemical composition of the substrate, including the chemical composition of the liner layer and/or the dielectric layer. The elevated temperature is sufficient to diffuse the dopant from the deposited precursor on the liner layer into the liner layer. Application of thermal energy breaks down the precursor and facilitates segregation of the dopant into the liner layer. Dopants such as zinc, indium, and gallium can easily segregate through cobalt or ruthenium. A dopant such as zinc, indium, or gallium can serve to stabilize the liner layer. For example, the dopant may limit diffusion of cobalt or ruthenium into surrounding materials such as a dielectric material or copper fill. In some implementations, the liner layer has a dopant concentration between about 1 atomic percent and about 20 atomic percent or between about 2 atomic percent and about 10 atomic percent.

At block 230 of the process 200, a self-formed barrier layer is formed at an interface between the liner layer and the dielectric layer while the substrate is exposed to the elevated temperature. The self-formed barrier layer comprises a reaction product between the dielectric layer and the dopant. Exposure to the elevated temperature, which may be similar to an annealing operation, segregates the elements in the liner layer so that the dopant diffuses to react with surrounding dielectric material. Without being limited by any theory, dopants such as zinc, indium, and gallium are oxygen-seeking and are drawn towards oxygen in the dielectric layer. Accordingly, the dopant of zinc, indium, or gallium will migrate towards the interface with the dielectric layer. Zinc, indium, and gallium are generally more electronegative than other metals. During exposure to the elevated temperature, the substrate may be exposed to a reducing environment or an environment substantially free of an oxidant in the atmosphere. That way, the dopant does not migrate towards the exposed surfaces of the liner layer. Instead, the dopant will diffuse towards the interface between the liner layer and the dielectric layer. The dopant of zinc, indium, or gallium will react with the silicon and oxygen of the dielectric layer to form a reaction product of zinc silicate, indium silicate, or gallium silicate. The reaction product is formed along the interface between the dielectric layer and the liner layer, thereby providing a self-formed barrier layer along the sidewalls and bottom surface of the recess. The reaction product of zinc silicate, indium silicate, or gallium silicate can serve as a diffusion barrier layer that limits diffusion of metal into the dielectric layer. This prevents the conductor metal from oxidizing and setting up a leakage current. In some implementations, the self-formed barrier layer may also be referred to as a self-formed adhesion layer. The self-formed barrier layer can serve as an adhesion layer that promotes adhesion between the dielectric layer and the liner layer or between the dielectric layer and a metal feature. In other words, the self-formed barrier layer can promote adhesion between dielectric material and metal.

Figure 3C:
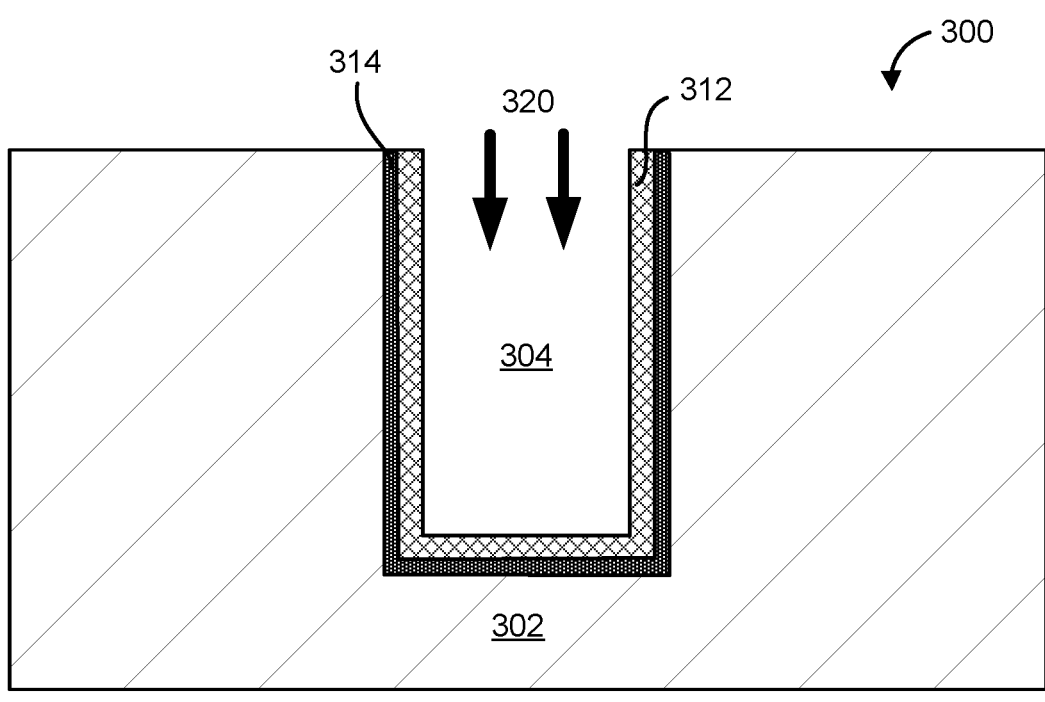

FIG. 3C shows a schematic illustration of the substrate from FIG. 3B with deposition of a precursor for top-down doping of a liner layer and formation of a self-formed barrier layer for a partially fabricated metal interconnect structure. Precursor 320 is flowed into the recess 304 to deposit onto exposed surfaces of the liner layer 312. The precursor 320 may be deposited onto the liner layer 312 by CVD. The precursor may 320 may be a metal organic compound in the gas phase, where the metal organic compound includes a dopant of zinc, indium, or gallium. During deposition by CVD, the substrate 300 may be exposed to an elevated temperature. The elevated temperature promotes diffusion of dopant into the liner layer 312 to provide a doped liner layer. In some implementations, the liner layer 312 has a dopant concentration between about 1 atomic percent and about 20 atomic percent or between about 2 atomic percent and about 10 atomic percent.

During exposure to the elevated temperature, the dopant segregates through the liner layer and migrates towards the dielectric layer 302. The substrate 300 may be exposed to an atmosphere that is a reducing environment or at least free of oxygen or oxygen-containing gases. The dopant reacts with the dielectric layer 302 to form a self-formed barrier layer 314. The self-formed barrier layer 314 may be a reaction product between the dopant and silicon and oxygen. The reaction product may be a silicate such as a zinc silicate, indium silicate, or gallium silicate. The self-formed barrier layer 314 is positioned at an interface between the liner layer 312 and the dielectric layer 302. The formation of the self-formed barrier layer 314 may occur simultaneous with CVD of the precursor 320. Put another way, the formation of the self-formed barrier layer 314 may occur simultaneous with top-down doping of the liner layer 312. The self-formed barrier layer 314 may serve as a diffusion barrier layer and/or adhesion layer. The self-formed barrier layer 314 may have negligible impact on line resistance of the metal interconnect structure.

Returning to FIG. 2, at block 240 of the process 200, a self-formed protective layer comprising zinc oxide, indium oxide, or gallium oxide is optionally formed at exposed surfaces of the liner layer. The self-formed protective layer may be formed after formation of the self-formed barrier layer. The self-formed protective layer may be formed prior to metallization of the recess. The self-formed protective layer comprises a reaction product between oxygen in the surrounding atmosphere and the dopant. In some implementations, the substrate is transferred out of a reaction chamber to expose the substrate to an air break, where the self-formed protective layer is formed during exposure to the air break. The liner layer of the substrate may be doped in the reaction chamber such as a reaction chamber for performing CVD, and the substrate may be subsequently transferred to an electrodeposition chamber for performing electrofill of metal. An example reaction chamber for performing CVD is shown in FIG. 8.

As discussed earlier, dopants such as zinc, indium, and gallium are oxygen-seeking and may be drawn towards oxygen in the surrounding atmosphere or environment. The dopant of zinc, indium, or gallium may migrate towards the interface between the liner layer and the surrounding atmosphere containing oxygen. Specifically, the dopant of zinc, indium, or gallium may migrate towards the air to form a protective oxide. Thus, the self-formed protective layer serves to protect the liner layer from oxidation during the air break. This prevents formation of oxides such as ruthenium oxide and cobalt oxide, as such oxides are undesirable for electrodeposition of metal (e.g., copper) in the recess.

Figure 3D:
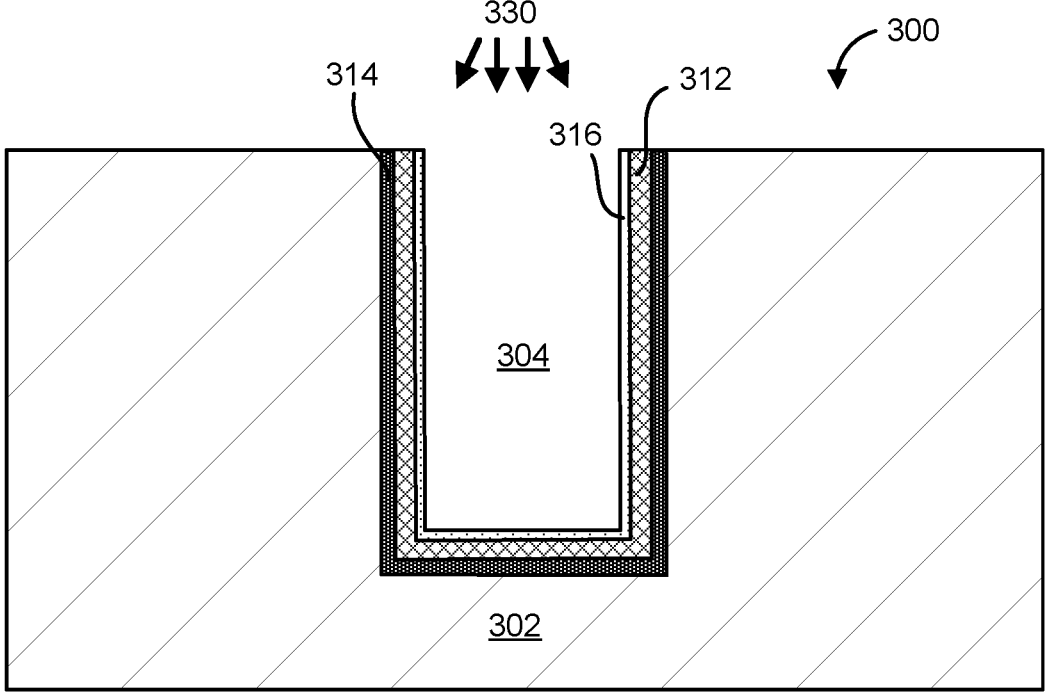

FIG. 3D shows a cross-sectional schematic illustration of the substrate from FIG. 3C with formation of a self-formed protective layer during exposure to an air break for a partially fabricated metal interconnect structure. After doping the liner layer 312 and forming the self-formed barrier layer 314, the substrate 300 may be exposed to an air break 330. The air break 330 may occur during transfer of the substrate 300 from a reaction chamber for performing CVD doping to another processing chamber. The air break 330 exposes the substrate 300 to an oxygen-containing atmosphere so that the dopant in the liner layer 312 may migrate towards an interface between the liner layer 312 and the oxygen-containing atmosphere. A reaction between the dopant and oxygen in the oxygen-containing atmosphere causes formation of an oxide. The oxide provides the self-formed protective layer 316 at the interface between the liner layer 312 and the oxygen-containing atmosphere. In some implementations, the self-formed protective layer 316 comprises zinc oxide, indium oxide, or gallium oxide. The self-formed protective layer 316 is formed along sidewalls and the bottom surface of the recess. As shown in FIG. 3D, the liner layer 312 is sandwiched between the self-formed barrier layer 314 and the self-formed protective layer 316, where the self-formed barrier layer 314 lines the interface with the dielectric layer 302, and where the self-formed protective layer 316 lines the interface with the recess 304.

Returning to FIG. 2, at block 250 of the process 200, the recess is optionally filled with metal, where the self-formed barrier layer is formed after formation of the liner layer and before filling the recess with metal. In some implementations, the self-formed protective layer is removed prior to filling the recess with metal. The recess may be filled using a suitable deposition method such as physical vapor deposition (PVD), chemical vapor deposition (CVD), electroplating, or electroless plating. The filled recess may provide one or more metal features of a metal interconnect structure, where the one or more metal features may include a copper via and/or copper lines. In some implementations, the metal of the metal interconnect structure includes copper. In some implementations, the metal of the metal interconnect structure includes cobalt, aluminum, or tungsten. In some implementations, the filled recess may provide an electrically conductive interconnect structure that provides electrical interconnection between metal lines. After filling the recess with metal, any metal overburden may be planarized using a planarization process such as CMP.

In some implementations, the process 200 further includes annealing the substrate after filling the recess with metal. Annealing the substrate may occur at temperatures that cause diffusion of dopant into the metal. Accordingly, the metal (e.g., copper) may be doped with a dopant of zinc, indium, or gallium. In some implementations, a concentration of dopant in the metal fill may be between about 0.5 atomic percent and about 5 atomic percent, between about 1 atomic percent and about 3 atomic percent, or between about 1 atomic percent and about 2 atomic percent. This provides a doped metal feature such as a doped conductive via. The doped metal feature may include, for example, copper zinc. The doped metal feature may have improved resistance to oxidation. In some implementations, annealing the substrate may occur at a temperature between about 80° C. and about 400° C. However, it will be understood that in the present disclosure, doping the liner layer and forming the self-formed barrier layer occur without annealing the substrate.

Figure 3E:
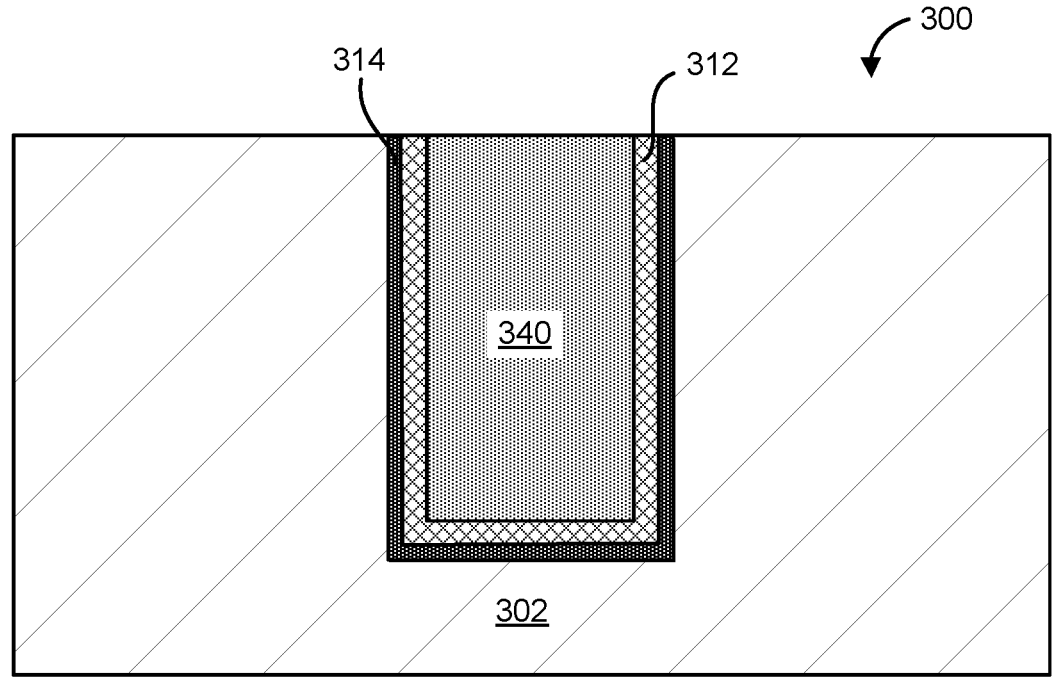

FIG. 3E shows a cross-sectional schematic illustration of the substrate from FIG. 3D with metal fill of the recess for a metal interconnect structure. The self-formed protective layer 316 may be removed prior to filling the recess with metal. Metal may be deposited in the recess 304 to form a metal feature 340. In some implementations, the metal feature 340 may be a conductive via providing electrical interconnection between metal lines. In some implementations, the metal feature 340 may include one or more metal lines in a metal interconnect structure. Metal may fill or at least substantially fill the recess 304. The metal may be deposited using any suitable deposition technique such as electroplating or electroless plating. The metal feature 340 is formed over the liner layer 312 and the self-formed barrier layer 314 so that the liner layer 312 and the self-formed barrier layer 314 are sandwiched between the metal feature 340 and the dielectric layer 302. The metal feature 340 may be doped with the dopant of zinc, indium, or gallium. In some implementations, the substrate 300 may be annealed to cause the metal feature 340 to be doped.

In the present disclosure, aspects of a metal interconnect structure may be shown in FIG. 3E, where the metal interconnect structure includes a first metal line (not shown), a dielectric layer 302 over the first metal line, and a metal feature 340 extending through the dielectric layer 302 providing electrical interconnection between the first metal line and a second metal line. In some implementations, each of the first metal line and the second metal line may include copper, cobalt, aluminum, or tungsten. The metal interconnect structure may further include a liner layer 312 along sidewalls and a bottom surface of the metal feature 340, a self-formed barrier layer 314 at an interface between the dielectric layer 302 and the liner layer 312, where the self-formed barrier layer 314 includes a reaction product between the dielectric layer 302 and a dopant of zinc, indium, or gallium.

Selective Doping of Metal Feature to Strengthen Diffusion Barrier Layer

In some implementations of the present disclosure, doping may occur after metallization. Introduction of a dopant of zinc, indium, or gallium may occur by CVD at an elevated temperature on a metal feature. Precursor is flowed that selectively deposits on the metal feature by CVD, where the precursor contains the dopant. Selective deposition of the precursor forms a capping layer on the metal feature. During exposure to the elevated temperature, the dopant diffuses into the metal feature to create a doped metal feature. Some of the dopant may segregate through the metal feature and through the layer liner. The dopant may migrate to an interface between a diffusion barrier layer and the liner layer. The presence of the dopant at the interface between the diffusion barrier layer and the liner layer strengthens diffusion barrier properties of the diffusion barrier layer. For example, where the diffusion barrier layer is porous, discontinuous, or thin, the dopant can serve to fill in gaps, discontinuities, and thin areas to strengthen the diffusion barrier layer. In addition, the presence of the capping layer on the metal feature enhances resistance to electromigration and/or stress migration. Furthermore, the presence of the dopant in the metal feature enhances resistance to oxidation.

FIG. 4 shows a flow diagram of an example method of selectively doping a metal interconnect structure according to some implementations. Accompanying the description of the process 400 in FIG. 4 is a series of cross-sectional schematic illustrations of an example process of forming a capping layer and selectively doping a metal interconnect structure to strengthen a diffusion barrier layer. One or more operations of the process 400 may be performed using an apparatus as shown in FIG. 8 or 9.

At block 410 of the process 400, a substrate is received having a recess in a dielectric layer, a diffusion barrier layer formed along sidewalls and a bottom surface of the recess, and a liner layer formed along the diffusion barrier layer. The dielectric layer may also be referred to as an interlayer dielectric or insulating layer. In some implementations, the dielectric layer includes a dielectric material or low-k dielectric material, where the dielectric material may include silicon and oxygen. For example, the dielectric layer includes silicon oxide, fluorine-doped or carbon-doped silicon oxide, or an organic-containing low-k material such as an OSG. The recess may be formed through at least a portion of the dielectric layer. The recess may be patterned and formed using standard lithography processes. The recess may have a high aspect ratio or high depth-to-width aspect ratio. In some implementations, an aspect ratio of the recess may be equal to or greater than about 5:1, equal to or greater than about 10:1, equal to or greater than about 20:1, or equal to or greater than about 30:1. The recess may be formed according to a damascene or dual damascene fabrication process.

In some implementations, the recess includes a trench formed in an upper portion of the dielectric layer and an opening formed in a lower portion of the dielectric layer. The opening may extend from a bottom of the trench to a top surface of a first metal line. Thus, the opening may expose the top surface of the first metal line. The trench and the opening may be formed according to a dual damascene fabrication process.

A diffusion barrier layer is deposited along the sidewalls and bottom surface of the recess. The diffusion barrier layer serves to limit diffusion of metal into the dielectric layer. In some implementations, the diffusion barrier layer is conformally deposited along surfaces of the dielectric layer in the recess. In damascene or dual damascene fabrication processes, the diffusion barrier layer may be conformally deposited along surfaces of the dielectric layer in the recess and on a top surface of a first metal line. In some implementations, the diffusion barrier layer includes tantalum, tantalum nitride, titanium, or titanium nitride. In some implementations, a thickness of the diffusion barrier layer is between about 0.5 nm and about 10 nm, or between about 1 nm and about 5 nm. It will be understood that the diffusion barrier layer may be a weakened diffusion barrier layer, where the weakened diffusion barrier layer may be thinned in order to meet scaling requirements. As a result, the weakened diffusion barrier layer may no longer be continuous and may be porous.

A liner layer is deposited along the diffusion barrier layer. In some implementations, the liner layer is conformally deposited along the diffusion barrier layer in the recess. In some implementations, the liner layer includes cobalt, ruthenium, or combinations thereof. In some implementations, a thickness of the liner layer is between about 0.5 nm and about 10 nm or between about 1 nm and about 5 nm.

Figure 5A:
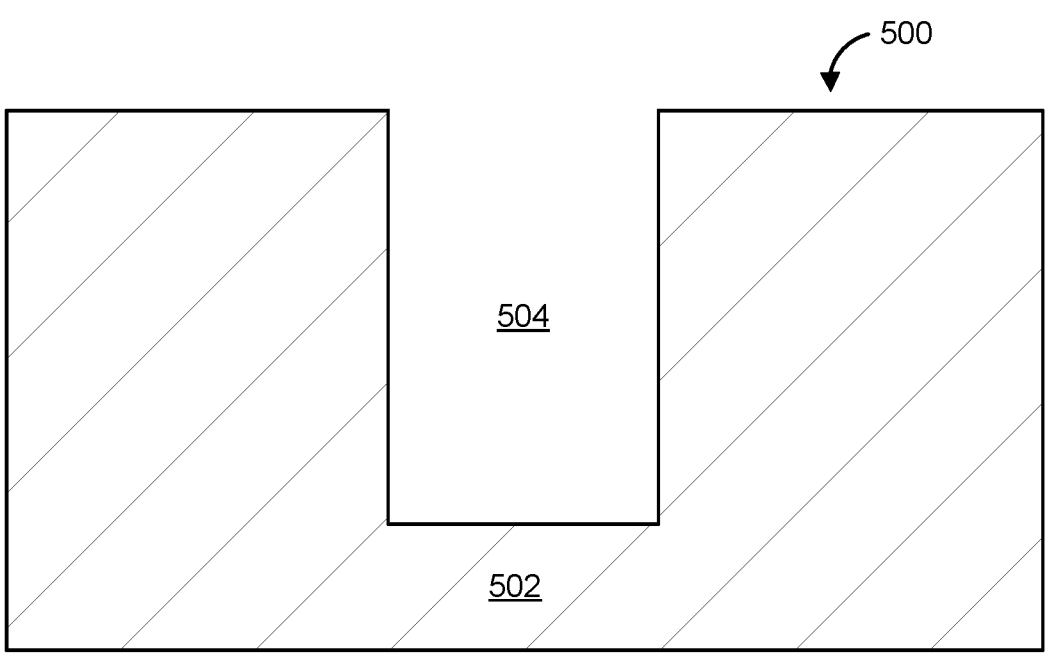
FIGS. 5A-5E show cross-sectional schematic illustrations of an example process of forming a capping layer and selectively doping a metal interconnect structure to strengthen a diffusion barrier layer according to some implementations.

FIG. 5A shows a cross-sectional schematic illustration of an example substrate with a dielectric layer having a recess for a partially fabricated metal interconnect structure. A substrate 500 includes a dielectric layer 502. The dielectric layer 502 has a recess 504 extending at least partially through the dielectric layer 502. The recess 504 may be an etched feature that is patterned using standard lithography techniques. The recess 504 may have a depth-to-width aspect ratio of at least 5:1, at least 10:1, at least 20:1, or at least 30:1. The recess 504 may have any suitable geometric shape or series of geometric shapes, such as cylindrical, rectangular, or polygonal. The dielectric layer 502 includes a dielectric material such as silicon oxide, fluorine-doped or carbon-doped silicon oxide, or an organic-containing low-k material such as an OSG. In some implementations, the dielectric layer 502 may include multiple layers of dielectric materials.

Figure 5B:
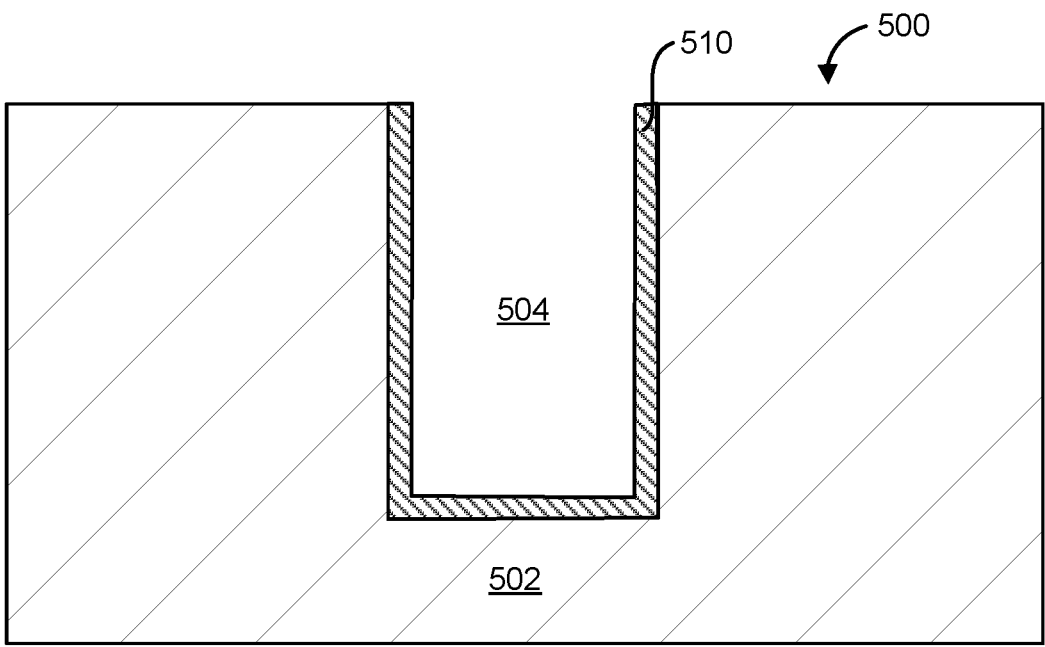

FIG. 5B shows a cross-sectional schematic illustration of the substrate from FIG. 5A with a diffusion barrier layer conformally deposited along sidewalls and a bottom surface of the recess for a partially fabricated metal interconnect structure. A diffusion barrier layer 510 is conformally deposited along sidewalls and a bottom surface of the recess 504 of the dielectric layer 502. In some implementations, the diffusion barrier layer 510 is deposited using any suitable deposition technique such as PVD, ALD, CVD, or PECVD. In some implementations, the diffusion barrier layer 510 includes tantalum, tantalum nitride, titanium, or titanium nitride. In some implementations, a thickness of the diffusion barrier layer 510 is between about 0.5 nm and about 10 nm or between about 1 nm and about 5 nm.

Figure 5C:
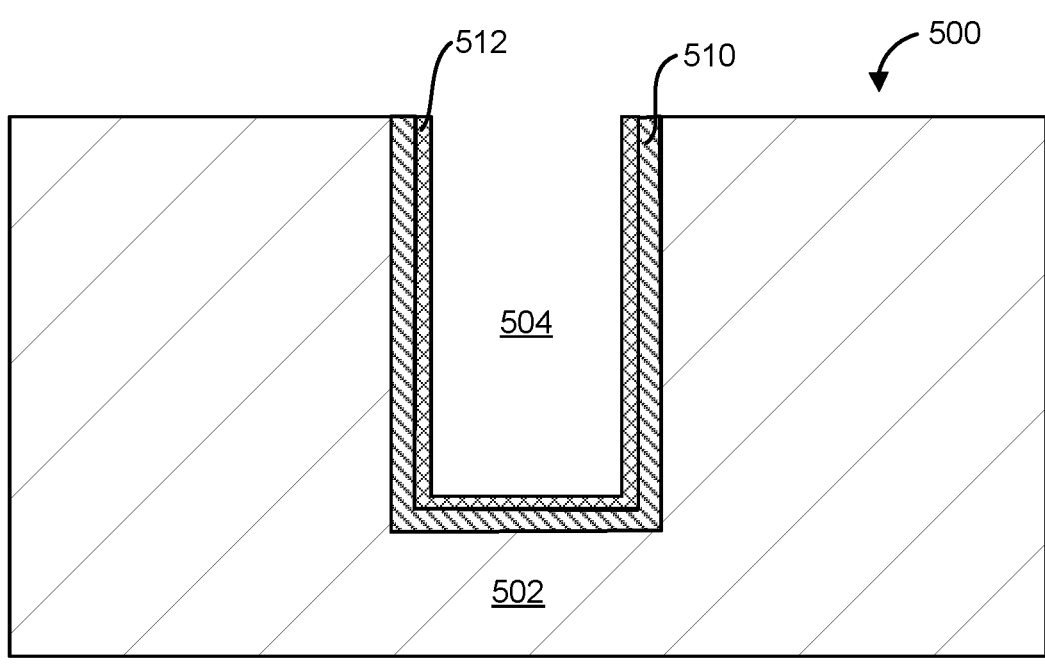

FIG. 5C shows a cross-sectional schematic illustration of the substrate from FIG. 5B with a liner layer conformally deposited on the diffusion barrier layer for a partially fabricated metal interconnect structure. A liner layer 512 is conformally deposited on the diffusion barrier layer 510 along sidewalls and the bottom surface of the recess 504, where the diffusion barrier layer 510 is sandwiched between the dielectric layer 502 and the liner layer 512. In some implementations, the liner layer 512 is deposited using any suitable deposition technique such as PVD, ALD, CVD, or PECVD. In some implementations, the liner layer 512 includes cobalt, ruthenium, or combinations thereof. In some implementations, a thickness of the liner layer 512 is between about 0.5 nm and about 10 nm or between about 1 nm and about 5 nm.

Returning to FIG. 4, at block 420 of the process 400, the recess is filled with metal to form a metal feature in the recess. The recess may be filled using any suitable deposition method such as PVD, CVD, electroplating, or electroless plating. The metal feature may be part of a metal interconnect structure, where the metal feature may include a copper via and/or copper line. In some implementations, the metal of the metal interconnect structure includes copper. In some implementations, the metal of the metal interconnect structure includes cobalt, aluminum, or tungsten. In some implementations, the filled recess may provide an electrically conductive interconnect structure that provides electrical interconnection between metal lines. In some implementations, the recess is filled with metal after forming the liner layer and before forming a capping layer. The recess may be filled with metal without doping the metal. After filling the recess with metal, any metal overburden may be planarized using a planarization process such as CMP.

Figure 5D:
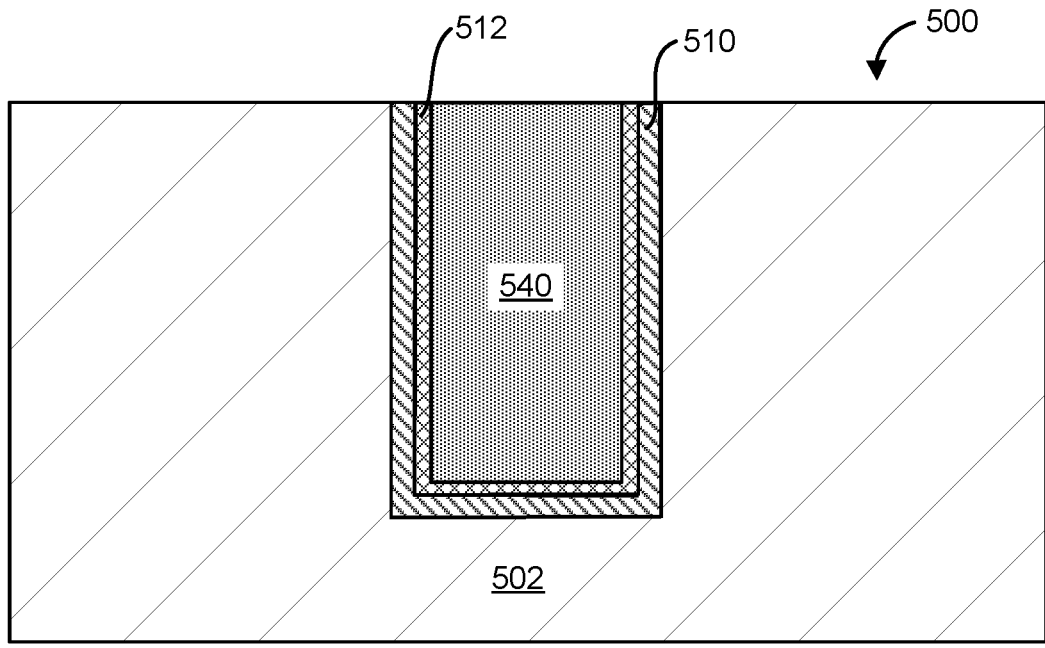

FIG. 5D shows a cross-sectional schematic illustration of the substrate from FIG. 5C with metal fill of the recess for a partially fabricated metal interconnect structure. Metal may be deposited in the recess 504 to form a metal feature 540. In some implementations, the metal feature 540 may be a conductive via providing electrical interconnection between metal lines. In some implementations, the metal feature 540 may include one or more metal lines in a metal interconnect structure. Metal may fill or at least substantially fill the recess 504. The metal may be deposited using any suitable deposition technique such as electroplating or electroless plating. The metal feature 540 is formed over the liner layer 512 and the diffusion barrier layer 510 so that the liner layer 512 and the diffusion barrier layer 510 are sandwiched between the metal feature 540 and the dielectric layer 502. The metal feature 540 is not doped with a dopant during filling.

Returning to FIG. 4, at block 430 of the process 400, a precursor containing zinc, indium, or gallium is selectively deposited by CVD on the metal feature at an elevated temperature, where the metal feature is doped with a dopant of zinc, indium, or gallium. In some implementations, the precursor contains zinc and the dopant consists of zinc. A precursor in the gas phase may be flowed towards the substrate and adsorbed onto exposed surfaces of the metal feature. The precursor may be deposited selectively on the metal feature without depositing on the dielectric layer. In some implementations, the precursor may be deposited selectively on the metal feature without depositing on the liner layer and the diffusion barrier layer. Rather than blanket deposition on the substrate, CVD may enable selective deposition of the precursor on metal materials (e.g., copper) but not on dielectric materials (e.g., oxide). In some implementations, the precursor may be a suitable zinc-containing compound such as diethyl zinc or dimethyl zinc. In some implementations, the precursor may be a suitable indium-containing compound such as trimethyl indium. In some implementations, the precursor may be a suitable gallium-containing compound such as trimethyl gallium. Selective deposition of the precursor on the metal feature occurs after metallization (e.g., copper fill).

Selective deposition of the precursor on the metal feature forms a capping layer on the metal feature. The capping layer is not deposited on the dielectric layer. In some implementations, the capping layer is not deposited on the liner layer or diffusion barrier layer. The capping layer may directly contact the metal feature across exposed surfaces of the metal feature. The capping layer may include zinc, indium, or gallium. For example, the capping layer may include zinc. Thus, the capping layer may include a metallic material. When dielectric materials are subsequently deposited over the metal feature, the capping layer improves adhesion between the metal feature and the dielectric materials. Moreover, the capping layer improves resistance to electromigration and/or stress migration. The capping layer can limit metal contamination in adjacent dielectric materials and prevent electromigration-induced failures. Typically, capping layers like cobalt may be deposited on a metal feature for improved adhesion and improved resistance to electromigration. However, a capping layer of zinc, indium, or gallium deposited by CVD may function similarly or with improved adhesion and improved resistance to electromigration compared to cobalt.

Deposition of the precursor on the metal feature may occur while the substrate is exposed to the elevated temperature to promote thermal diffusion of dopant into the metal feature. In some implementations, the elevated temperature is between about 60° and about 500° C. or between about 80° C. and about 400° C. However, it will be understood that the temperature range of the elevated temperature may depend on the chemical composition of the substrate, including the chemical composition of the metal feature, the liner layer, the diffusion barrier layer, and/or the dielectric layer. The elevated temperature is sufficient to diffuse the dopant from the capping layer into the metal feature. Application of thermal energy facilitates segregation of the dopant into the metal feature. Dopants such as zinc, indium, and gallium can easily segregate through metal such as copper. In addition, the dopant of zinc, indium, or gallium can react/alloy with metal to form a doped metal (e.g., copper) feature. For example, the doped metal feature can include copper zinc. Doping the metal feature does not occur simultaneous with depositing the metal feature in the recess, but doping the metal feature occurs in top-down manner following metal fill. The doped metal feature may exhibit improved material properties. For example, the doped metal feature may have improved resistance to electromigration and improved resistance to oxidation, which reduces the likelihood of electromigration-induced failures and TDDB-induced failures. In some implementations, the metal feature has a dopant concentration between about 0.5 atomic percent and about 5 atomic percent, between about 1 atomic percent and about 3 atomic percent, or between about 1 atomic percent and about 2 atomic percent.

In some implementations of the process 400, the dopant diffuses into the liner layer and to an interface between the liner layer and the diffusion barrier layer. The elevated temperature is sufficient to cause further migration of the dopant from the capping layer through the metal feature and into the liner layer. Dopant migration may occur simultaneous with selective deposition of the precursor by CVD at the elevated temperature. A dopant such as zinc, indium, or gallium can serve to stabilize the liner layer. For example, the dopant may limit diffusion of cobalt or ruthenium into surrounding materials such as a dielectric material. In some implementations, the liner layer has a dopant concentration between about 1 atomic percent and about 20 atomic percent or between about 2 atomic percent and about 10 atomic percent. Furthermore, a dopant such as zinc, indium, or gallium in the liner layer or in an interface between the liner layer and the diffusion barrier layer may limit diffusion of metal into the dielectric layer. This effect adds to the diffusion barrier properties of the diffusion barrier layer. Hence, the dopant diffuses through the liner layer to strengthen diffusion barrier properties of the diffusion barrier layer. In some implementations, the dopant may patch gaps, pores, discontinuities, or thin areas of the diffusion barrier layer to strengthen diffusion barrier properties.

In some implementations, the dopant may diffuse to an interface between the dielectric layer and the diffusion barrier layer to form a self-formed barrier layer. The self-formed barrier layer may be a reaction product between the dopant and silicon and oxygen. The reaction product may be a silicate such as a zinc silicate, indium silicate, or gallium silicate. The reaction product is formed along the interface between the dielectric layer and the liner layer. The reaction product of zinc silicate, indium silicate, or gallium silicate can serve as a diffusion barrier that limits diffusion of metal into the dielectric layer, thereby strengthening the diffusion barrier layer adjacent to the self-formed barrier layer.

In some implementations, the process 400 further includes annealing the substrate after selectively depositing the capping layer by CVD on the metal feature. Annealing the substrate may cause further diffusion of dopant into the metal and liner layer. In some implementations, annealing the substrate may occur at a temperature between about 80° C. and about 400° C.

Figure 5E:
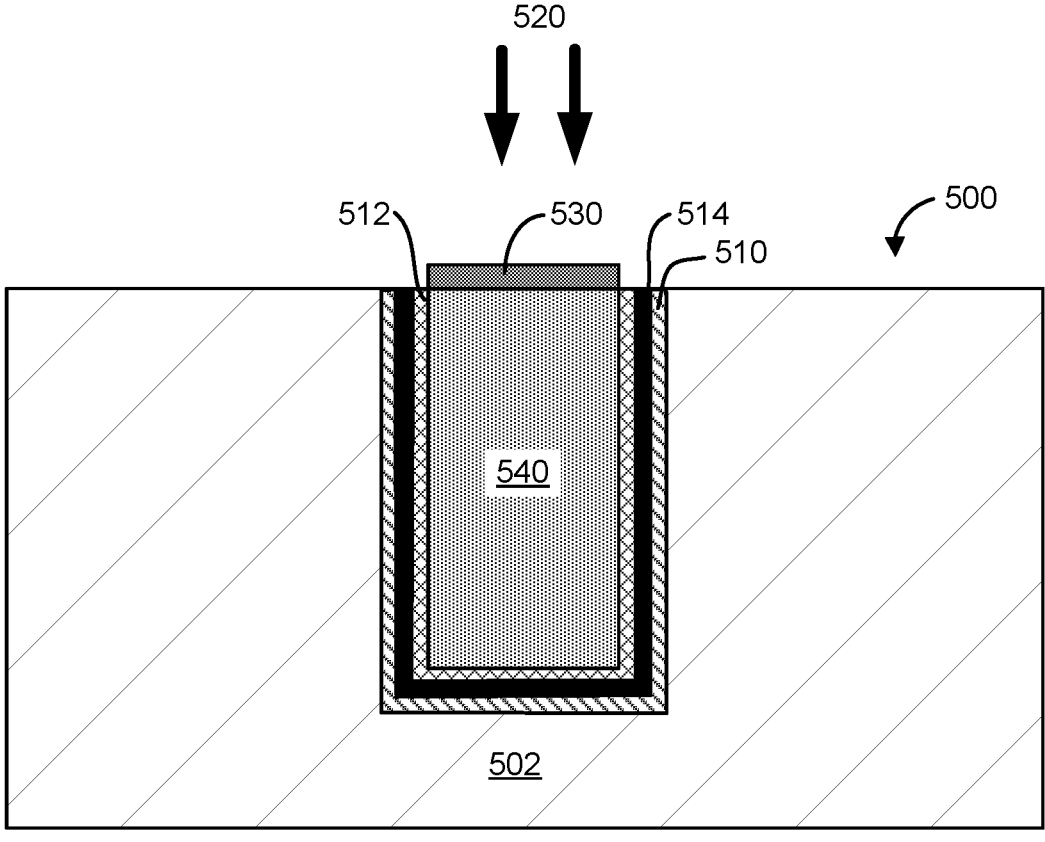

FIG. 5E shows a cross-sectional schematic illustration of the substrate from FIG. 5D with selective deposition of a capping layer on the metal feature by CVD for a metal interconnect structure. Precursor 520 is flowed onto the metal feature 540 to deposit onto exposed surfaces of the metal feature 540. Precursor 520 is selectively deposited by CVD on the metal feature 540 without depositing on the dielectric layer 502. The precursor 520 may be a metal organic compound in the gas phase, where the metal organic compound includes a dopant of zinc, indium, or gallium. Selective deposition of the precursor 520 on the metal feature 540 forms a capping layer 530. The capping layer 530 includes a metal such as zinc, indium, or gallium. The capping layer 530 is positioned directly on a top surface of the metal feature 540, where the capping layer 530 improves resistance to electromigration and/or stress migration.

During the deposition by CVD, the substrate 500 may be exposed to an elevated temperature. The elevated temperature promotes diffusion of dopant into the metal feature 540 to provide a doped metal feature. The metal feature 540 with dopant may have enhanced resistance to oxidation. Rather than doping the metal feature 540 simultaneous with deposition of metal in a recess, doping occurs in a top-down manner after deposition of the metal feature 540. In some implementations, the metal feature 540 has a dopant concentration between about 0.5 atomic percent and about 5 atomic percent, between about 1 atomic percent and about 3 atomic percent, or between about 1 atomic percent and about 2 atomic percent. In some implementations, the substrate 500 may be exposed to an atmosphere that is a reducing environment or at least free of oxygen or oxygen-containing gases.

In some implementations, the elevated temperature promotes diffusion of dopant into the liner layer 512, in an interface 514 between the liner layer 512 and the diffusion barrier layer 510, and into the diffusion barrier layer 510. The elevated temperature causes segregation of the dopant through the metal feature 540 and into the liner layer 512. The liner layer 512 may be doped with a dopant concentration between about 1 atomic percent and about 20 atomic percent, or between about 2 atomic percent and about 10 atomic percent. The dopant may further migrate towards the interface 514 between the liner layer 512 and the diffusion barrier layer 510. The interface 514 may comprise a high concentration of dopant. In some implementations, the interface 514 may comprise ruthenium and zinc or cobalt and zinc, where a concentration of zinc may be at least about 5 atomic percent, at least about 10 atomic percent, or at least about 20 atomic percent. The interface 514 having a high concentration of dopant may strengthen diffusion barrier properties of the diffusion barrier layer 510, limiting diffusion of metal into the dielectric layer 502. The interface 514 may patch gaps, pores, or thin areas of the diffusion barrier layer 510 to strengthen diffusion barrier properties. Thus, the doped metal interconnect structure has improved diffusion barrier layer properties, improved resistance to oxidation, and improved resistance to electromigration and/or stress migration.

In the present disclosure, aspects of a metal interconnect structure may be shown in FIG. 5E, where the metal interconnect structure includes a first metal line (not shown), a dielectric layer 502 over the first metal line, and a metal feature 540 extending through the dielectric layer 502 providing electrical interconnection between the first metal line and a second metal line. In some implementations, each of the first metal line and the second metal line may include copper, cobalt, aluminum, or tungsten. The metal interconnect structure may further include a diffusion barrier layer 510 and a liner layer 512 along sidewalls and a bottom surface of the metal feature 540, where the liner layer 512 is positioned over the diffusion barrier layer 510. The liner layer 512 may be doped with a dopant of zinc, indium, or gallium. The metal interconnect structure further includes a capping layer 530 of zinc, indium, or gallium directly on the metal feature 540. The metal feature 540 may be doped with the dopant of zinc, indium, or gallium.

Selective Doping of Metal Feature to Form Self-Formed Barrier Layer

In some implementations of the present disclosure, a capping layer may be selectively deposited by CVD or electroless deposition (ELD), and a self-formed barrier layer may be formed between a metal feature and a dielectric layer after metallization. The capping layer includes zinc, indium, or gallium. The capping layer is selectively deposited on the metal feature without depositing on the dielectric layer. The capping layer is exposed to an elevated temperature during deposition or after deposition. During exposure to the elevated temperature, the dopant diffuses into the metal feature to create a doped metal (e.g., copper) feature. The presence of the capping layer enhances resistance to electromigration and/or stress migration, and the presence of dopant in the metal feature enhances resistance to oxidation. Some of the dopant may segregate through the metal feature and react with silicon and oxygen in the dielectric layer to form the self-formed barrier layer. The self-formed barrier layer may include zinc silicate, indium silicate, or gallium silicate. The self-formed barrier layer may line the sidewalls of the metal feature to limit diffusion of metal into the dielectric layer.

FIG. 6 shows a flow diagram of an example method of selectively doping a metal interconnect structure according to some implementations. Accompanying the description of the process 600 in FIG. 6 is a series of cross-sectional schematic illustrations of an example process of forming a capping layer and selectively doping a metal interconnect structure to form a self-formed barrier layer. One or more operations of the process 600 may be performed using an apparatus as shown in FIG. 8 or 9.

At block 610 of the process 600, a substrate is received having a recess in a dielectric layer. The dielectric layer may also be referred to as an interlayer dielectric or insulating layer. In some implementations, the dielectric layer includes a dielectric material or low-k dielectric material, where the dielectric material may include silicon and oxygen. For example, the dielectric layer includes silicon oxide, fluorine-doped or carbon-doped silicon oxide, or an organic-containing low-k material such as an OSG. The recess may be formed through at least a portion of the dielectric layer. The recess may be patterned and formed using standard lithography processes. The recess may have a high aspect ratio or high depth-to-width aspect ratio. In some implementations, an aspect ratio of the recess may be equal to or greater than about 5:1, equal to or greater than about 10:1, equal to or greater than about 20:1, or equal to or greater than about 30:1. The recess may be formed according to a damascene or dual damascene fabrication process.

In some implementations, the recess includes a trench formed in an upper portion of the dielectric layer and an opening formed in a lower portion of the dielectric layer. The opening may extend from a bottom of the trench to a top surface of a first metal line. Thus, the opening may expose the top surface of the first metal line. The trench and the opening may be formed according to a dual damascene fabrication process.

In some implementations, a liner layer may be optionally formed along sidewalls of the recess. The liner layer may be conformally deposited along exposed surfaces of the recess and may include cobalt, ruthenium, or combinations thereof. However, no diffusion barrier layer is formed in the substrate.

Figure 7A:
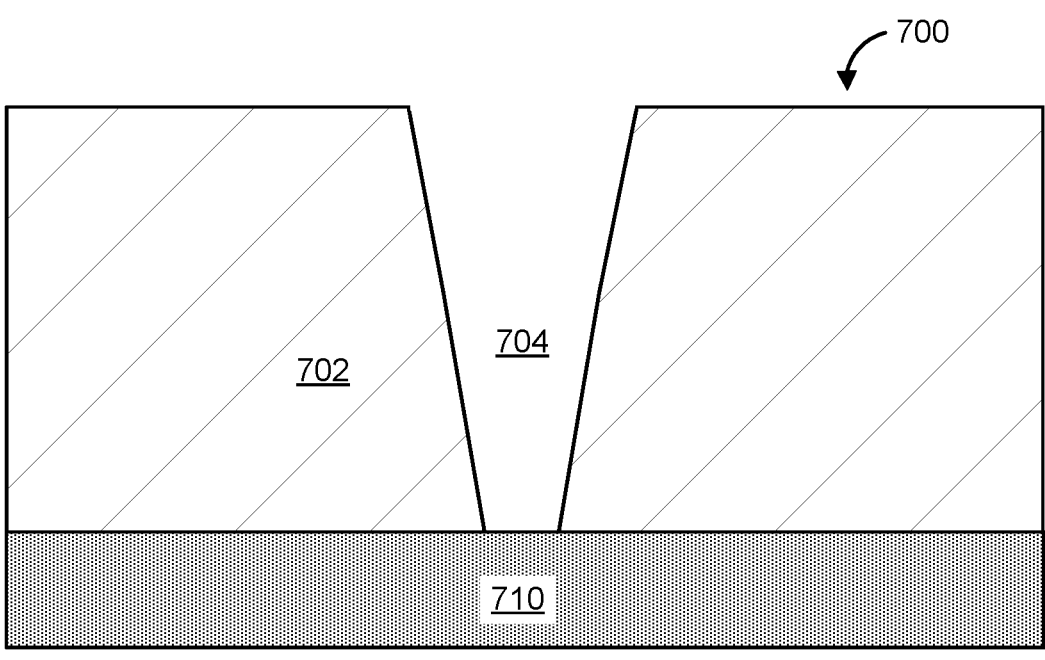
FIGS. 7A-7D show a cross-sectional schematic illustrations of an example process of forming a capping layer and selectively doping a metal interconnect structure to provide a self-formed diffusion barrier layer according to some implementations.

FIG. 7A shows a cross-sectional schematic illustration of an example substrate with a dielectric layer having a recess for a partially fabricated metal interconnect structure. A substrate 700 includes a dielectric layer 702 over a metal line 710. The dielectric layer 702 has a recess 704 extending at least partially through the dielectric layer 702. The recess 704 may be an etched feature that is patterned using standard lithography techniques. The recess 704 may have a depth-to-width aspect ratio of at least 5:1, at least 10:1, at least 20:1, or at least 30:1. The recess 704 may have any suitable geometric shape or series of geometric shapes, such as cylindrical, rectangular, or polygonal. As shown in FIG. 7A, the recess 704 may be tapered, where a bottom of the recess 704 exposes a top surface of the metal line 710. The dielectric layer 702 includes a dielectric material such as silicon oxide, fluorine-doped or carbon-doped silicon oxide, or an organic-containing low-k material such as an OSG. In some implementations, the dielectric layer 702 may include multiple layers of dielectric materials.

Returning to FIG. 6, at block 620 of the process 600, the recess is filled with metal to form a metal feature in the recess. The recess may be filled using any suitable deposition method such as PVD, CVD, electroplating, or electroless plating. The metal feature may be part of a metal interconnect structure, where the metal feature may include a copper via and/or copper line. In some implementations, the metal of the metal interconnect structure includes copper. In some implementations, the metal of the metal interconnect structure includes cobalt, aluminum, or tungsten. In some implementations, the filled recess may provide an electrically conductive interconnect structure that provides electrical interconnection between metal lines. In some implementations, the recess is filled with metal after forming the recess and before forming a capping layer. The recess may be filled with metal without doping the metal. In some implementations, a liner layer may be positioned between the metal feature and the dielectric layer along the sidewalls of the recess. In some implementations, the metal feature may directly contact one or more metal lines without any diffusion barrier layer and/or liner layer between the metal feature and one or more metal lines. The absence of a diffusion barrier layer and/or liner layer reduces the overall electrical resistance in the metal interconnect structure or metal via. In some implementations, the metal feature may be a metal via prefill. After filling the recess with metal, any metal overburden may be planarized using a planarization process such as CMP.

Figure 7B:
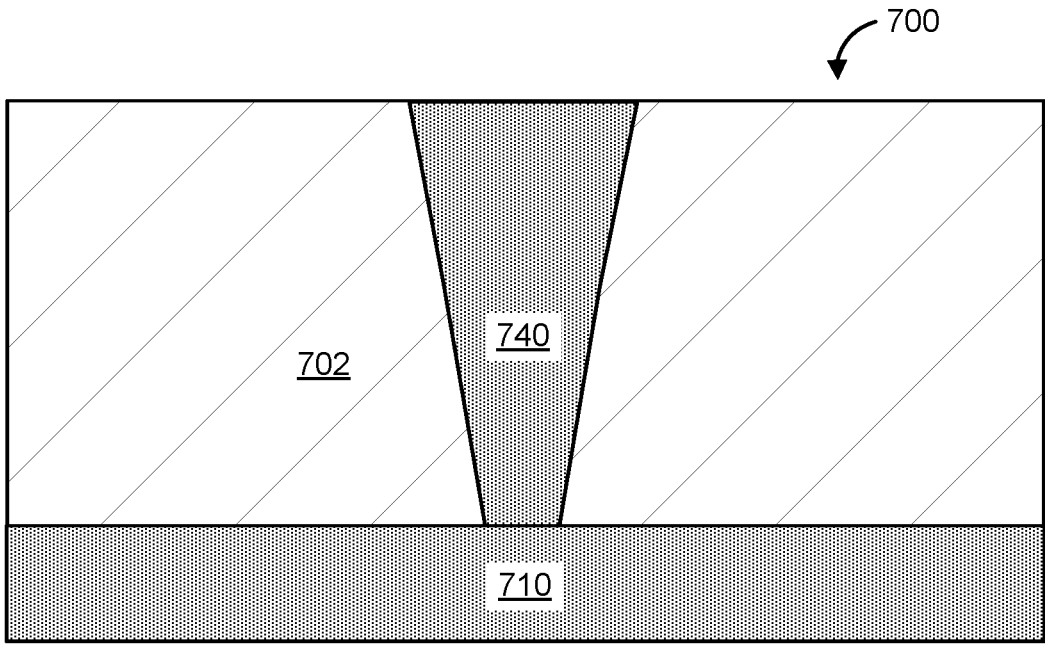

FIG. 7B shows a cross-sectional schematic illustration of the substrate from FIG. 7A with metal fill of the recess for a partially fabricated metal interconnect structure. Metal may be deposited in the recess 704 to form a metal feature 740. In some implementations, the metal feature 740 may be a conductive via providing electrical interconnection between metal lines, including metal line 710. As shown in FIG. 7B, the metal feature 740 directly contacts the metal line 710. In some implementations, the metal feature 740 may include a conductive via as well as one or more metal lines in a metal interconnect structure. Metal may fill or at least substantially fill the recess 704. The metal may be deposited using any suitable deposition technique such as electroplating or electroless plating. The metal feature 740 is formed directly over the metal line 710 and without any diffusion barrier layer or liner layer between the metal feature 740 and the dielectric layer 702. However, in some implementations not shown in FIGS. 7A-7D, a liner layer may be provided between the dielectric layer 702 and the metal feature 740. The metal feature 740 is not doped with a dopant during filling.

Returning to FIG. 6, at block 630 of the process 600, a capping layer is selectively deposited on the metal feature, where the capping layer includes a dopant of zinc, indium, or gallium. The capping layer may be deposited selectively on the metal feature without depositing on the dielectric layer. The capping layer may be deposited selectively on the metal feature by CVD or electroless deposition. In implementations where selective deposition occurs by CVD, precursor in the gas phase may be flowed towards the substrate and adsorbed onto exposed surfaces of the metal feature. Rather than blanket deposition, CVD may enable selective deposition of the precursor on metal materials (e.g., copper) but not on dielectric materials (e.g., oxide). In some implementations, the precursor may be a suitable zinc-containing compound such as diethyl zinc or dimethyl zinc. In implementations where selective deposition occurs by electroless deposition (i.e., electroless plating), the substrate may be exposed to a reducing chemical bath so that an autocatalytic chemical reduction occurs on a surface that supports electron transfer. Generally, non-metallic surfaces or oxidized surfaces are examples of surfaces that do not support electron transfer for autocatalytic chemical reduction. Thus, exposed surfaces of the metal feature may promote nucleation of metallic materials such as zinc, indium, or gallium on the metal feature. In some implementations, the reducing chemical bath includes indium ions to support electroless deposition of indium directly on the metal feature.

Selective deposition of the capping layer on the metal feature occurs after metallization (e.g., copper fill). The capping layer may directly contact the metal feature across exposed surfaces of the metal feature. The capping layer may include zinc, indium, or gallium. In one example, the capping layer includes zinc. In another example, the capping layer includes indium. Thus, the capping layer may include a metallic material. When dielectric materials are subsequently deposited over the metal feature, the capping layer improves adhesion between the metal feature and the dielectric materials. Additionally, the capping layer improves resistance to electromigration and/or stress migration. The capping layer can limit metal contamination in adjacent dielectric materials and prevent electromigration-induced failures.

Figure 7C:
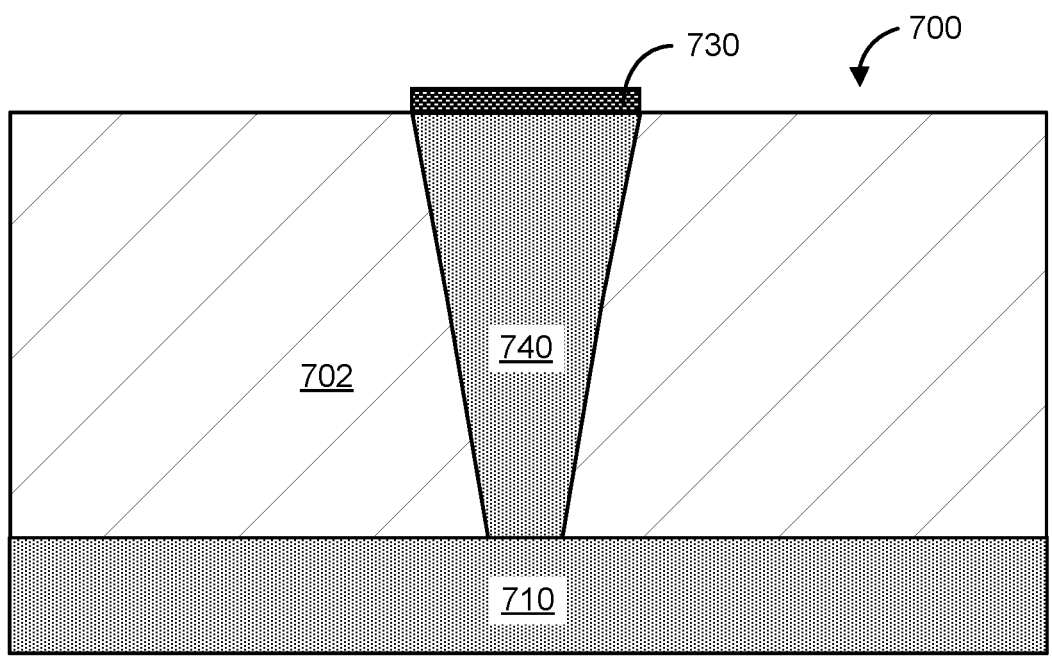

FIG. 7C shows a cross-sectional schematic illustration of the substrate from FIG. 7B with selective deposition of a capping layer for a partially fabricated metal interconnect structure. A capping layer 730 includes a metal such as zinc, indium, or gallium. The capping layer 730 is selectively deposited on the metal feature 740 without depositing on the dielectric layer 702. In some implementations, the capping layer 730 is deposited by CVD. The CVD process may be carried out at elevated temperature. During CVD, precursor is flowed onto the metal feature 740 to deposit onto exposed surfaces of the metal feature 740. Precursor is selectively deposited by CVD on the metal feature 740 without depositing on the dielectric layer 702. The precursor may be a metal organic compound in the gas phase, where the metal organic compound includes a dopant of zinc, indium, or gallium. In some implementations, the capping layer 730 is deposited by electroless plating. The electroless plating process may expose the substrate to a reducing chemical bath that causes nucleation of zinc, indium, or gallium on the metal feature 740 without nucleation on the dielectric layer 702. The capping layer 730 is positioned directly on a top surface of the metal feature 740, where the capping layer 730 improves resistance to electromigration and/or stress migration.

Returning to FIG. 6, at block 640 of the process 600, the substrate is exposed to an elevated temperature to cause the metal feature to be doped with the dopant of zinc, indium, or gallium and to form a self-formed barrier layer at an interface between the dielectric layer and the metal feature. In some implementations, the elevated temperature may be applied to the substrate during deposition of the capping layer. In some implementations, the elevated temperature may be applied to the substrate after deposition of the capping layer, such as in a post-deposition anneal. In some implementations, the elevated temperature is between about 60° and about 500° C. or between about 80° C. and about 400° C. However, it will be understood that the temperature range of the elevated temperature may depend on the chemical composition of the substrate, including the chemical composition of the metal feature and/or the dielectric layer. The elevated temperature is sufficient to diffuse the dopant from the capping layer into the metal feature. Application of thermal energy facilitates segregation of the dopant into the metal feature. Dopants such as zinc, indium, and gallium can easily segregate through metal such as copper. In addition, the dopant of zinc, indium, or gallium can react/alloy with metal to form a doped metal (e.g., copper) feature. For example, the doped metal feature may include copper zinc. Doping the metal feature does not occur simultaneous with depositing the metal feature in the recess, but doping the metal feature occurs in top-down manner following metal fill. The doped metal feature may exhibit improved material properties. For example, the doped metal feature may have improved resistance to electromigration and improved resistance to oxidation, which reduces the likelihood of electromigration-induced failures and TDDB-induced failures. In some implementations, the metal feature has a dopant concentration between about 0.5 atomic percent and about 5 atomic percent, between about 1 atomic percent and about 3 atomic percent, or between about 1 atomic percent and about 2 atomic percent.

The elevated temperature is sufficient to cause further migration of the dopant from the capping layer through the metal feature and to an interface between the metal feature and the dielectric layer. Some of the dopant may segregate through the metal feature and react with silicon and oxygen in the dielectric layer to form the self-formed barrier layer. The self-formed barrier layer may be a reaction product between the dopant and silicon and oxygen. The reaction product may be a silicate such as a zinc silicate, indium silicate, or gallium silicate. The reaction product is formed along the interface between the dielectric layer and the metal feature. Thus, the self-formed barrier layer is provided along sidewalls of the metal feature. The reaction product of zinc silicate, indium silicate, or gallium silicate can serve as a diffusion barrier that limits diffusion of metal into the dielectric layer. In addition, the reaction product of zinc silicate, indium silicate, or gallium silicate can serve as an adhesion layer between the dielectric layer and the metal feature.

Figure 7D:
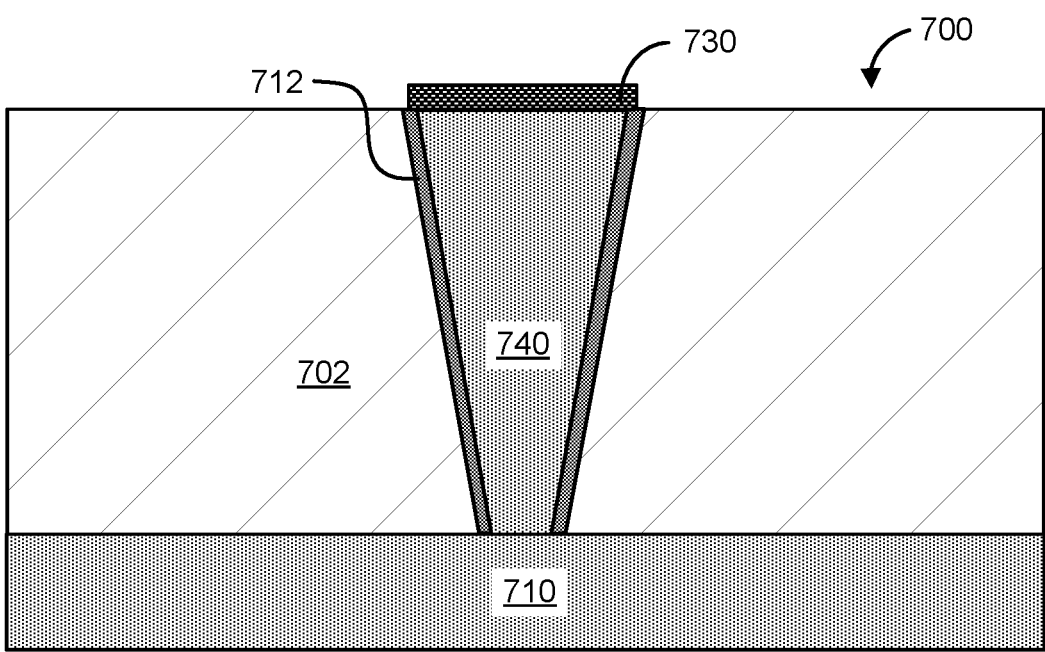

FIG. 7D shows a cross-sectional schematic illustration of the substrate from FIG. 7C with application of elevated temperature to form a self-formed barrier layer for a metal interconnect structure. The elevated temperature promotes diffusion of dopant into the metal feature 740 to provide a doped metal feature. The metal feature 740 with dopant may have enhanced resistance to oxidation. Rather than doping the metal feature 740 simultaneous with deposition of metal in a recess, doping occurs in a top-down manner after deposition of the metal feature 740. In some implementations, the metal feature 740 has a dopant concentration between about 0.5 atomic percent and about 5 atomic percent, between about 1 atomic percent and about 3 atomic percent, or between about 1 atomic percent and about 2 atomic percent. In some implementations, the substrate 700 may be exposed to an atmosphere that is a reducing environment or at least free of oxygen or oxygen-containing gases.

In some implementations, the elevated temperature promotes diffusion of dopant to an interface between the metal feature 740 and the dielectric layer 702. The elevated temperature causes segregation of the dopant through the metal feature 740 and towards the dielectric layer 702. The dopant reacts with the dielectric layer 702 to form a self-formed barrier layer 712. The self-formed barrier layer 712 may be a reaction product between the dopant and silicon and oxygen. The reaction product may be a silicate such as a zinc silicate, indium silicate, or gallium silicate. The formation of the self-formed barrier layer 712 may occur simultaneous with top-down doping of the metal feature 740. The self-formed barrier layer 712 may serve as a diffusion barrier layer and/or adhesion layer.

In the present disclosure, aspects of a metal interconnect structure may be shown in FIG. 7D, where the metal interconnect structure includes a first metal line 710, a dielectric layer 702 over the first metal line 710, and a metal feature 740 extending through the dielectric layer 702 providing electrical interconnection between the first metal line 710 and a second metal line (not shown). In some implementations, each of the first metal line 710 and the second metal line may include copper, cobalt, aluminum, or tungsten. The metal interconnect structure further includes a capping layer 730 of zinc, indium, or gallium directly on the metal feature 740. The metal interconnect structure further includes a self-formed barrier layer 712 along sidewalls of the metal feature 740. The metal interconnect structure does not include a diffusion barrier layer and/or liner layer. The metal feature 740 may be doped with the dopant of zinc, indium, or gallium.

Apparatus

FIG. 8 depicts a schematic illustration of an embodiment of CVD process station 800 having a process chamber 802. A plurality of CVD process stations may be included in a multi-station tool platform. For example, FIG. 9 depicts an embodiment of a multi-station processing tool 900. In some embodiments, one or more hardware parameters of CVD process station 800, including those discussed in detail below, may be adjusted programmatically by one or more controllers 850.

CVD process station 800 fluidly communicates with reactant delivery system 801a for delivering process gases to a distribution showerhead 806. Reactant delivery system 801a includes a mixing vessel 804 for blending and/or conditioning process gases, such as precursor-containing gas, for delivery to showerhead 806. One or more mixing vessel inlet valves 820 may control introduction of process gases to mixing vessel 804. In various embodiments, deposition of a precursor is performed in CVD process station 800 and in some implementations, other operations such as anneal, pre-treatment, and copper electrofill may be performed in the same or another station of the multi-station processing tool 900 as further described below with respect to FIG. 9.

As an example, the implementation of FIG. 8 includes a vaporization point 803 for vaporizing liquid reactant to be supplied to the mixing vessel 804. In some implementations, vaporization point 803 may be a heated vaporizer. In some implementations, a liquid precursor or liquid reactant may be vaporized at a liquid injector (not shown). For example, a liquid injector may inject pulses of a liquid reactant into a carrier gas stream upstream of the mixing vessel 804. In one implementation, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 806. In some implementations, a liquid flow controller (LFC) upstream of vaporization point 803 may be provided for controlling a mass flow of liquid for vaporization and delivery to process chamber 802.

Showerhead 806 distributes process gases toward substrate 812. In the implementation shown in FIG. 8, the substrate 812 is located beneath showerhead 806 and is shown resting on a pedestal 808. Showerhead 806 may have any suitable shape, and may have any suitable number and arrangement of ports for distributing process gases to substrate 812.

In some embodiments, pedestal 808 may be raised or lowered to expose substrate 812 to a volume between the substrate 812 and the showerhead 806. In some embodiments, pedestal 808 may be temperature controlled via heater 810. Pedestal 808 may be set to any suitable temperature, such as between about 60° C. and about 500° C. or between about 80° C. and about 400° C. during operations for performing various disclosed implementations. It will be appreciated that, in some implementations, pedestal height may be adjusted programmatically by a suitable controller 850. At the conclusion of a process phase, pedestal 808 may be lowered during another substrate transfer phase to allow removal of substrate 812 from pedestal 808.

In some implementations, a position of showerhead 806 may be adjusted relative to pedestal 808 to vary a volume between the substrate 812 and the showerhead 806. Further, it will be appreciated that a vertical position of pedestal 808 and/or showerhead 806 may be varied by any suitable mechanism within the scope of the present disclosure. In some implementations, pedestal 808 may include a rotational axis for rotating an orientation of substrate 812. It will be appreciated that, in some implementations, one or more of these example adjustments may be performed programmatically by one or more suitable controllers 850. The controller 850 may include any of the features described below with respect to system controller 950 of FIG. 9.

In some implementations where plasma may be used, showerhead 806 and pedestal 808 electrically communicate with a radio frequency (RF) power supply 814 and matching network 816 for powering a plasma. In some implementations, the plasma energy may be controlled by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Likewise, RF power supply 814 may provide RF power of any suitable frequency. In some implementations, RF power supply 814 may be configured to control high- and low-frequency RF power sources independently of one another. Example low-frequency RF frequencies may include, but are not limited to, frequencies between 0 kHz and 900 kHz. Example high-frequency RF frequencies may include, but are not limited to, frequencies between 1.8 MHz and 2.45 GHz, or greater than about 13.56 MHz, or greater than 27 MHz, or greater than 80 MHz, or greater than 60 MHz. It will be appreciated that any suitable parameters may be modulated discretely or continuously to provide plasma energy for surface reactions.

In some embodiments, instructions for a controller 850 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a process gas (e.g., the precursor containing dopant). The recipe phase may further include instructions for controlling the temperature of the substrate 812 via the pedestal 808.

Further, in some implementations, pressure control for process station 800 may be provided by butterfly valve 818. As shown in the implementation of FIG. 8, butterfly valve 818 throttles a vacuum provided by a downstream vacuum pump (not shown). However, in some implementations, pressure control of process station 800 may also be adjusted by varying a flow rate of one or more gases introduced to the process station 800.

As described above, one or more process stations may be included in a multi-station processing tool. FIG. 9 shows a schematic view of an implementation of a multi-station processing tool 900 with an inbound load lock 902 and an outbound load lock 904. A robot 906, at atmospheric pressure, is configured to move wafers from a cassette loaded through a pod 908 into inbound load lock 902 via an atmospheric port 910. A wafer (not shown) is placed by the robot 906 on a pedestal 912 in the inbound load lock 902, the atmospheric port 910 is closed, and the load lock inbound 902 is pumped down. Where the inbound load lock 902 includes a remote plasma source, the wafer may be exposed to a remote plasma treatment in the inbound load lock 902 prior to being introduced into a processing chamber 914. Further, the wafer also may be heated in the inbound load lock 902 as well, for example, to remove moisture and adsorbed gases. Next, a chamber transport port 916 to processing chamber 914 is opened, and another robot (not shown) places the wafer into the reactor on a pedestal of a first station shown in the reactor for processing. While the implementation depicted in FIG. 9 includes load locks, it will be appreciated that, in some implementations, direct entry of a wafer into a process station may be provided.

The depicted processing chamber 914 includes four process stations, numbered from 1 to 8 in the implementation shown in FIG. 9. Each station has a heated pedestal (shown at 918 for station 1), and gas line inlets. It will be appreciated that in some implementations, each process station may have different or multiple purposes. For example, in some implementations, a process station may be switchable between an ALD and CVD process mode. In some implementations, processing chamber 914 may include one or more matched pairs of ALD and CVD process stations. Further, exposure to a pre-treatment gas or plasma and CVD process may occur in the same or different stations. While the depicted processing chamber 914 includes four stations, it will be understood that a processing chamber according to the present disclosure may have any suitable number of stations. For example, in some implementations, a processing chamber may have five or more stations, while in other embodiments a processing chamber may have three or fewer stations.

FIG. 9 depicts an implementation of a wafer handling system 990 for transferring wafers within processing chamber 914. In some implementations, wafer handling system 990 may transfer wafers between various process stations and/or between a process station and a load lock. It will be appreciated that any suitable wafer handling system may be employed. Non-limiting examples include wafer carousels and wafer handling robots. FIG. 9 also depicts an implementation of a system controller 950 employed to control process conditions and hardware states of process tool 900. System controller 950 may include one or more memory devices 956, one or more mass storage devices 954, and one or more processors 952. Processor 952 may include a CPU or computer, analog, and/or digital input/output connections, stepper motor controller boards, etc.

In some implementations, system controller 950 controls all of the activities of process tool 900. System controller 950 executes system control software 958 stored in mass storage device 954, loaded into memory device 956, and executed on processor 952. Alternatively, the control logic may be hard coded in the system controller 950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 958 may include instructions for controlling the timing, mixture of gases, gas flow rates, chamber and/or station pressure, chamber and/or station temperature, plasma exposure duration, UV radiation duration, wafer temperature, target power levels, RF power levels, substrate pedestal, chuck and/or susceptor position, and other parameters of a particular process performed by process tool 900. System control software 958 may be configured in any suitable way. For example, various process tool component subroutines or control objects may be written to control operation of the process tool components used to carry out various process tool processes. System control software 958 may be coded in any suitable computer readable programming language.

In some implementations, system control software 958 may include input/output control (IOC) sequencing instructions for controlling the various parameters described above. Other computer software and/or programs stored on mass storage device 954 and/or memory device 956 associated with system controller 950 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 918 and to control the spacing between the substrate and other parts of process tool 900.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A pressure control program may include code for maintaining the pressure in the reaction chamber in accordance with the implementations herein.

In some implementations, there may be a user interface associated with system controller 950. The user interface may include a display screen, graphical software displays of the apparatus and/or process conditions, and user input devices such as pointing devices, keyboards, touch screens, microphones, etc.

In some implementations, parameters adjusted by system controller 950 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 950 may provide program instructions for implementing the above-described deposition processes. The program instructions may control a variety of process parameters, such as DC power level, RF bias power level, pressure, temperature, etc. The instructions may control the parameters to operate doping of metal (e.g., copper) and/or liner layers according to various implementations described herein.

The system controller 950 will typically include one or more memory devices and one or more processors configured to execute the instructions so that the apparatus will perform a method in accordance with disclosed implementations. Machine-readable media containing instructions for controlling process operations in accordance with disclosed implementations may be coupled to the system controller 950.

In some implementations, the system controller 950 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 950, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 950 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 950 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 950, in some implementations, may be a part of or coupled to a computer that is integrated with, coupled to the system, otherwise networked to the system, or a combination thereof. For example, the system controller 950 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 950 receives instructions in the form of data, which specify parameters for each of the processing steps to be performed during one or more operations. It should be understood that the parameters may be specific to the type of process to be performed and the type of tool that the system controller 950 is configured to interface with or control. Thus as described above, the system controller 950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

While FIGS. 8 and 9 provide examples of chambers and tools that may be used to perform the methods disclosed herein, various modifications may be made.

Without limitation, example systems may include a plasma etch chamber or module, a deposition chamber or module, a spin-rinse chamber or module, an electroplating chamber or electroless plating chamber module, a clean chamber or module, an anneal chamber or module, a bevel edge etch chamber or module, a PVD chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 950 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

In the foregoing description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations are described in conjunction with the specific implementations, it will be understood that it is not intended to limit the disclosed implementations.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of forming a self-formed barrier layer, the method comprising:
   receiving a substrate having a recess in a dielectric layer and a liner layer formed along sidewalls and a bottom surface of the recess;
   depositing, by chemical vapor deposition (CVD), a precursor containing zinc, indium, or gallium on the liner layer at a temperature to break down the precursor and to dope the liner layer with a dopant of zinc, indium, or gallium; and
   forming, at an interface between the liner layer and the dielectric layer while the substrate is exposed to the temperature, a self-formed barrier layer comprising a reaction product between the dielectric layer and the dopant.

2. The method of claim 1, further comprising:
   forming, at exposed surfaces of the liner layer in an oxygen-containing atmosphere, a self-formed protective layer comprising zinc oxide, indium oxide, or gallium oxide.

3. The method of claim 2, further comprising:
   transferring the substrate out of a reaction chamber to expose the substrate to an air break, wherein the self-formed protective layer is formed during exposure to the air break.

4. The method of claim 1, further comprising:
   filling the recess with copper, wherein forming the self-formed barrier layer occurs after forming the liner layer and before filling the recess with copper.

5. The method of claim 1, wherein the dielectric layer includes silicon and oxygen, and wherein the self-formed barrier layer includes zinc silicate, indium silicate, or gallium silicate.

6. The method of claim 1, wherein the liner layer has a dopant concentration between about 1 atomic percent and about 20 atomic percent.

7. The method of claim 6, wherein doping the liner layer and forming the self-formed barrier layer occurs without annealing the substrate.

\* \* \* \* \*